(12) United States Patent
Rao et al.

(10) Patent No.: US 12,284,048 B1
(45) Date of Patent: Apr. 22, 2025

(54) AUTOMATIC SIGNAL COMPOSITION FOR MEDIA CONFERENCES

(71) Applicant: Amazon Technologies, Inc., Seattle, WA (US)

(72) Inventors: Siddhartha Shankara Rao, Seattle, WA (US); Michael Klingbeil, North Haven, CT (US); Arvindh Krishnaswamy, Palo Alto, CA (US); John Joseph Dunne, Bremertom, WA (US)

(73) Assignee: Amazon Technologies, Inc., Seattle, WA (US)

( * ) Notice: Subject to any disclaimer, the term of this patent is extended or adjusted under 35 U.S.C. 154(b) by 247 days.

(21) Appl. No.: 17/364,384

(22) Filed: Jun. 30, 2021

(51) Int. Cl.
*H04L 12/18* (2006.01)
*G10L 21/0356* (2013.01)
*H03H 21/00* (2006.01)
*H04M 3/56* (2006.01)

(52) U.S. Cl.
CPC ...... *H04L 12/1827* (2013.01); *G10L 21/0356* (2013.01); *H03H 21/0025* (2013.01); *H04L 12/1822* (2013.01); *H04M 3/568* (2013.01); *H03H 2021/0034* (2013.01)

(58) Field of Classification Search
CPC . H04L 12/182; H03H 2021/034; H04M 3/568
USPC .................................................. 709/204
See application file for complete search history.

(56) References Cited

U.S. PATENT DOCUMENTS

| | | |
|---|---|---|
| 9,686,589 B2 | 6/2017 | Wang et al. |
| 10,536,288 B1 | 1/2020 | Leblang et al. |
| 12,047,536 B1 | 7/2024 | Rao et al. |
| 2003/0117486 A1 | 6/2003 | Ferren et al. |
| 2013/0022216 A1 | 1/2013 | Ganong, III et al. |
| 2013/0083149 A1* | 4/2013 | Hubner .............. H04N 21/2187 348/E7.083 |
| 2016/0094475 A1* | 3/2016 | Lynch ..................... H04L 47/19 348/14.12 |
| 2016/0308929 A1 | 10/2016 | Fu et al. |
| 2016/0337510 A1 | 11/2016 | Li et al. |
| 2016/0352708 A1* | 12/2016 | Fer ........................ H04M 7/006 |
| 2018/0132038 A1 | 5/2018 | Dickin et al. |
| 2019/0045312 A1 | 2/2019 | Gunawan et al. |
| 2019/0066654 A1 | 2/2019 | Dickins et al. |
| 2019/0174001 A1 | 6/2019 | Gilg et al. |
| 2020/0099792 A1 | 3/2020 | Nguyen et al. |

(Continued)

OTHER PUBLICATIONS

U.S. Appl. No. 17/364,295, filed Jun. 30, 2021, Rao et al.

(Continued)

*Primary Examiner* — Sibte H Bukhari
(74) *Attorney, Agent, or Firm* — BakerHostetler

(57) ABSTRACT

Implementations for compositing two input signals to form a higher quality signal are described. A first input signal is received from a first input device and a second input signal is received from a second input device. The first input signal and the second input signal are combined into a composite input signal. It is then determined that the composite input signal has a higher quality than either the first input signal or the second input signal individually. Based on that determination, the composite input signal is selected for use by the media conferencing service as part of a media conference.

17 Claims, 10 Drawing Sheets

(56) References Cited

U.S. PATENT DOCUMENTS

2022/0270628 A1* 8/2022 Ghosh ..................... G10L 21/02
2022/0319537 A1 10/2022 Michaelis et al.

OTHER PUBLICATIONS

U.S. Appl. No. 17/364,295; Non-Final Office Action; dated Jan. 21, 2022; 20 pages.
U.S. Appl. No. 17/364,295; Final Office Action; dated Jul. 26, 2022; 23 pages.
U.S. Appl. No. 17/364,295; Non-Final Office Action; dated Nov. 21, 2022; 27 pages.
U.S. Appl. No. 17/364,295; Final Office Action; dated Jun. 1, 2023; 27 pages.
U.S. Appl. No. 17/364,295; Notice of Allowance; dated Jun. 3, 2024; 12 pages.
U.S. Appl. No. 17/364,295; Notice of Allowance; dated Nov. 20, 2023; 9 pages.

* cited by examiner

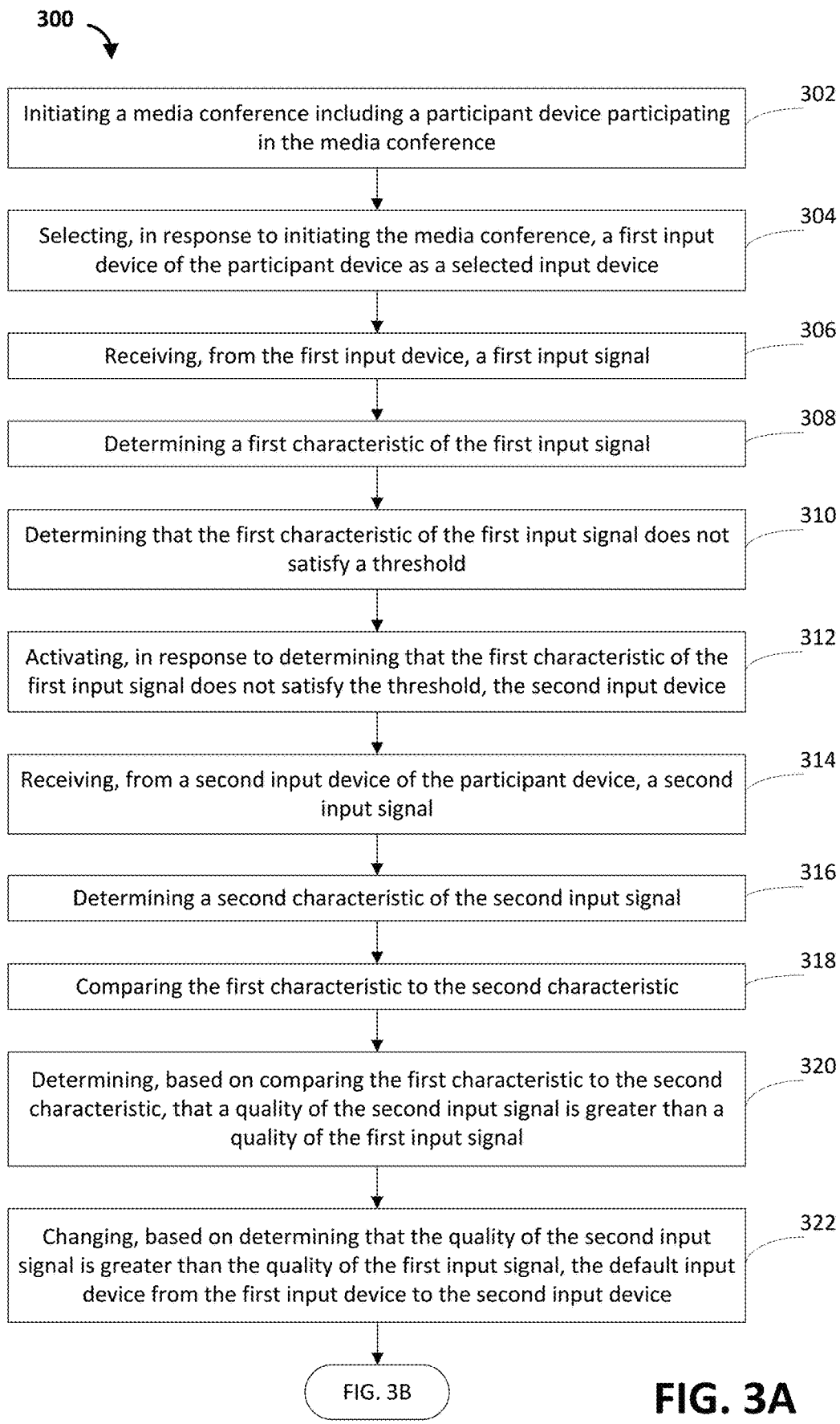

AUTOMATIC SIGNAL COMPOSITION FOR MEDIA CONFERENCES

BACKGROUND

Devices and service providers typically select a preferred input device based on different criteria. For example, the last input device that is plugged into a participant's device may be set as the preferred input device, or the input device that is built into the participant's device may be set as the preferred input device. For example, a webcam that is plugged in to a laptop may be selected as the preferred input device over another camera that is built into the laptop. In another example, a preferred a built-in microphone may be selected as the preferred device over a headset that is connected to the microphone.

However, the preferred input device may not provide the highest quality input signal. For example, a laptop may be closed in a docking station and, therefore, the built-in microphone of the laptop may transmit a muffled voice from the participant. In another example, a user may be moving about the laptop and, therefore, the input device receiving the clearest voice may change over time based on the location of the participant relative to the laptop. In yet another example, as the user moves about the laptop, the user may come in and out of the field of view of a preferred webcam.

BRIEF DESCRIPTION OF THE DRAWINGS

The detailed description is set forth below with reference to the accompanying figures. The use of the same reference numbers in different figures indicates similar or identical items. The systems depicted in the accompanying figures are not to scale and components within the figures may be depicted not to scale with each other.

FIGS. 3A-3B is a flowchart showing an example process for selecting an input device providing a higher quality input signal than the selected input device.

DETAILED DESCRIPTION

Figure 1A:
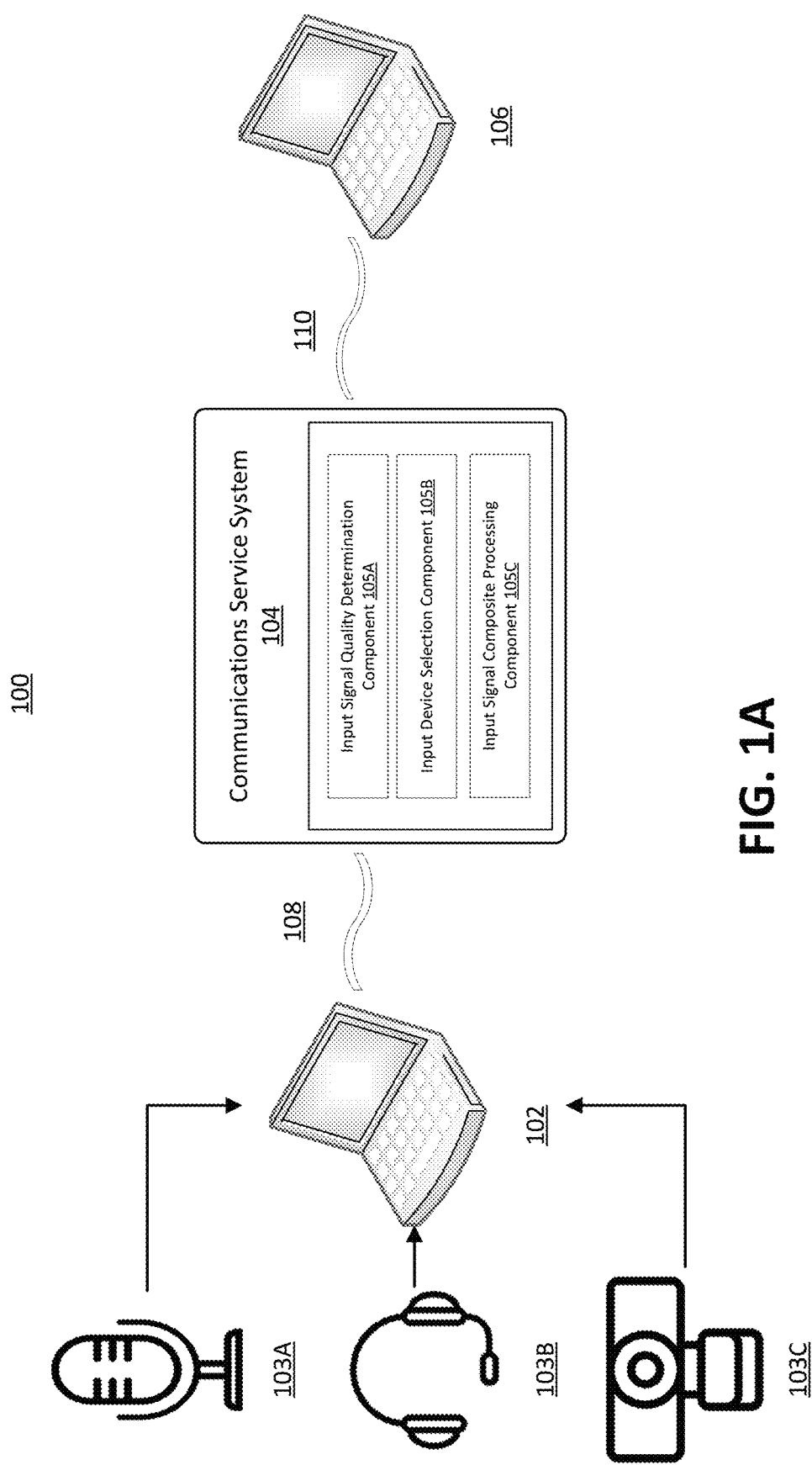
FIG. 1A schematically illustrates a first example of a high-level architecture of a communications service system in a service provider network.

Techniques and architecture for improving audio and/or video quality of a media conference by determining an optimal input device from among a plurality of input devices available to a participant or generating a composite signal from a plurality of input signals from the plurality of input devices available to the participant are described. The received input signals can be processed in a network service, e.g., media conferencing service, file hosting service, interactive electronic gaming service, etc., where participants of the network service are located in different locations. An input signal, such as an audio signal or a video signal, can be received from an input device of a participant, then processed by the network service, and finally transmitted to an output device.

Many participants of the network service have access to a plurality of input devices. For example, a laptop used by a participant to access the network service may include a built-in microphone, a built-in webcam, be attached to a headset, be attached to an external microphone, be attached to an external webcam, be in communication with a Bluetooth smart speaker, etc. Each one of these input devices can capture audio and/or video from the participant simultaneously. Depending on the settings of the input devices, such as noise cancellation, echo cancellation, reverberation correction, encoding, light filtering, focus filtering, cropping, color filtering, smoothing, etc., the hardware of the input device, and the position of the participant relative to the respective input device, the quality of the input signal from each input device can be different. For example, if a user is further from a built-in microphone than an external microphone, the input signal received from the external microphone maybe of higher quality than an input signal received from the built-in microphone. In another example, the hardware of an external input device may be of higher quality than the hardware of a built-in input device, thereby resulting in a higher quality input signal. In yet another example, the settings of a particular input device may result in a digitized sounding voice or artifacts in the video, whereas the setting of another input device may result in a higher quality voice or video.

The input device providing the highest quality input signal may change during the course of a network service. For example, a battery-powered input device may run out of power during a network service resulting in a stop in transmission of the input signal from that input device. In such a case, the input device needs to be changed to another input device that is powered. In another example, as the participant moves relative to a participant device, such as a laptop, the quality of an input signal from an initial input device may degrade. In such a case, the initial input device needs to be changed to another input device that is in closer proximity to the participant. In still another example, a new input device may be connected to the participant device during the course of the media session. The new input device may provide a higher quality input signal than the input device currently being used. In such a case, the initial input device needs to be changed to the new input device that was not previously available to the participant. In yet another example, a network connection may degrade during the course of a network service. For example, a home wireless network may have reduced bandwidth if another user in the home starts to stream high quality video. In such a case, the input device connected to the home wireless network may be changed to another input device in proximity to the participant that is connected to a mobile network.

The quality of an input signal being used in a network service can be monitored over time. For example, although an input signal initially satisfies a quality threshold, the input signal may degrade during the course of the network service to no longer satisfy the quality threshold. In such a case, the various input devices available to the participant of the network service can be activated, if they are not already, and input signals from the various input devices can be evaluated for quality. For example, an amplitude, a signal-to-noise ratio, reverberation, an echo, a voice naturalness, or a muffle of the input signals from the various input devices can be compared to one another to determine an input device providing the highest quality input signal. A service provider can then switch the input device from the initial input device to the input device providing the highest quality input signal.

In another example, if an input signal no longer satisfies the quality threshold, a service provider can combine two or more input signals from the various input devices to generate a higher quality composite input signal. For example, speech levels in a plurality of input signals can be normalized and then aligned, or synchronized, to form a composite input signal. In another example, a learning model, such as a machine learning model or a neural network, can be used to combine the two or more input signals to generate the higher quality composite input signal.

In addition to monitoring the quality of an input signal relative to a quality threshold over time, feedback from participants in the network service can be used to initiate a change of the input device and/or the generation of a composite input signal. For example, a participant may state that they cannot hear another participant in the network service or that the quality of the audio or video signal is not acceptable. Upon recognition of the feedback related to the content perception, the network service can initiate change of the input device and/or the generation of the composite input signal.

Certain implementations and embodiments of the disclosure are described more fully below with reference to the accompanying figures, in which various aspects are shown. However, the various aspects may be implemented in many different forms and should not be construed as limited to the specific implementations described herein. The disclosure encompasses variations of the described embodiments.

FIG. 1A illustrates a high-level architecture 100 of a communications service system in a service provider network, according to an embodiment. One or more participant devices 102 may provide content, such as audio signals and/or video signals 108, to a communications service system 104. The communications services can be, for example, audio conferencing, video conferencing, chatting, gaming services, etc. The communications service system 104 can be implemented in one or more computing systems, such as one or more hosting servers, as explained in further detail below. The communications service system 104 can process the content received from the one or more participant devices 102 and output the processed content, such as the processed audio signals and/or video signals 110, to one or more output devices 106.

The participant device 102 can be, for example, a laptop, although the participant device 102 can be any type of device, such as a desktop computer, a portable computing device, a smart phone, a tablet, etc. The participant device 102 can include a plurality of input devices, such as a built-in microphone or a built-in webcam, and can also be attached to external input devices 103A-C. The external input devices 103A-C can be, for example, an external microphone 103A, a headset 103B, and an external webcam 103C. The participant device 102 can generate an input signal based on its built-in input devices and/or based on any of the external input devices 103A-C. The output device 106 can be a laptop, as illustrated in FIG. 1A, and can also be any other device configured to output a content signal. For example, the output device 106 can be a speaker, such as a wireless smart speaker, a phone, such as a smartphone, and/or a display, such as a television, monitor, projector, etc.

The communications service system 104 may include one or more components 105A-C for processing the one or more input signals 108 received from the participant device 102, for switching the input device 103A-C, and for compositing two or more of the input signals 108. Although three components 105A-C are shown in FIG. 1A, the communications service system 104 can include any number of components. The communications service system 104 can then send the processed content signal 110 to the one or more output devices 106 simultaneously.

The communications service system 104 includes an input signal quality determination component 105A that can objectively determine the quality of an input signal 108. The input signal quality determination component 105A can determine the quality of an input signal 108 by determining an amplitude, a signal-to-noise ratio, reverberation, an echo, a voice naturalness, or a muffle of the input signal 108. The input signal quality determination component 105A can also determine the quality of an input signal 108 by analyzing the shape of the signal, the digitization of the signal, the framerate of the signal, the bit rate of the signal, etc. The input signal quality determination component 105A can also monitor the quality of the input signal 108 throughout the duration of the network session. In this way, a change in the quality of the input signal 108 can be detected by the input signal quality determination component 105A. For example, the input signal quality determination component 105A can compare the signal-to-noise ratio of the input signal 108 to a predetermined threshold and determine that, following the start of the network session, the signal-to-noise ratio of the input signal 108 no longer satisfies the predetermined threshold, indicating a low quality input signal 108.

Although objective quality measurements are described above, the input signal quality determination component 105A can also determine subjective feedback. The communications service system 104 may request feedback from the users orally or via a graphical user interface to determine whether the quality of output signal 110 is high or low, or acceptable or not acceptable, thereby indicating the quality of the input signal 108. In some embodiments, the communications service system 104 may also request the level of quality of the output signal 110 using, for example, a ranking of one through ten. The subjective feedback from the participant in the network session can also be received orally. For example, a participant in the network session may state that the content has broken up or cannot be heard, thereby indicating a low quality or unacceptable input signal 108.

The determination of the quality of the input signal 108 can also be based on both objective measures and subjective feedback. For example, the objective measures and the subjective feedback can be combined using, for example, a weighted sum or other heuristics. In some embodiments, artificial intelligence or a machine learning algorithm can be applied by the input signal quality determination component 105A to determine the quality of the input signal 108. The artificial intelligence or machine learning algorithm can be trained based on historical input signals and data indicating acceptable or unacceptable quality.

The determination of the quality of the input signal 108 can also be based on the detection of unsavory sounds. Unsavory sounds can include background noise, such as crowd noise, animal noise, other folks speaking, construction noise, road noise, etc. The quality of the input signal can be inversely proportional to the magnitude of unsavory sounds, such that the greater the magnitude of unsavory sounds, the lower the quality of the input signal. The identification of unsavory sounds can be based on a sound detection module.

The communications service system 104 also includes an input device selection component 105B that can automatically select an input device used to capture content associated with the participant, such as speech or video of the participant in the network session, based on the quality of the input signal 108 with or without human intervention. If the input signal quality determination component 105A indicates that the input signal 108 is unacceptable or of low quality, then a change in the input device can be initiated. The input device selection component 105B can then compare the quality of each input signal 108 received from the input signal quality determination component 105A to determine the input device providing the highest quality input signal. For example, the input device selection component 105B can compare the signal-to-noise ratio of the various input signals from the participant device 102 and the external input devices 103A-C to determine which input device provides the highest quality input signal. That device can then be selected to provide the input signal 108 for use in the network session. In some embodiments, the input device that provides the highest quality input signal can be set as a selected input device for the participant.

The communications service system 104 includes an input signal composite processing component 105C. If the input signal quality determination component 105A indicates that the input signal 108 is unacceptable or of low quality, instead of or in addition to changing the input device, the input signal composite processing component 105C can combine the various input signals received from the participant device 102 and the external input devices 103A-C to generate a composite input signal having a higher quality that an any of the individual input signals. To combine the various input audio signals, speech levels in a plurality of input signals can be normalized and then aligned to generate the composite input signal. To combine the various input video signals, frames can be aligned to generate the composite input signal. In some embodiments, the input signal composite processing component 105C may incorporate a learning model, such as a machine learning model or a neural network, can be used to combine the plurality of input signals to generate the higher quality composite input signal.

Figure 1B:
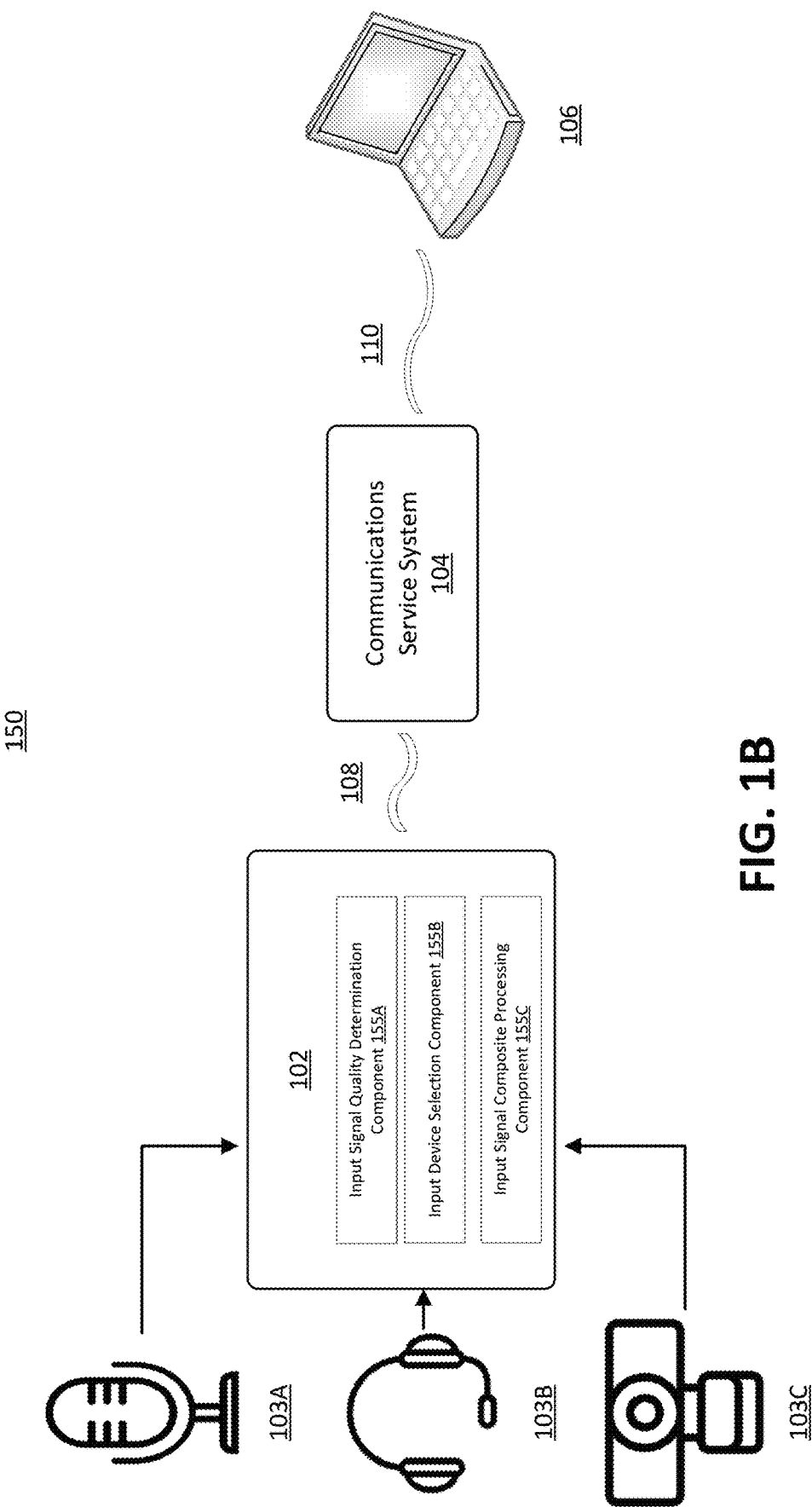
FIG. 1B schematically illustrates a second example of a high-level architecture of a communications service system in a service provider network.

FIG. 1B illustrates a high-level architecture 150 of a communications service system in a service provider network, according to an embodiment. One or more participant devices 102 may provide content, such as audio signals and/or video signals 108, to a communications service system 104. The communications services can be, for example, audio conferencing, video conferencing, chatting, gaming services, etc. The communications service system 104 can be implemented in one or more computing systems, such as one or more hosting servers, as explained in further detail below. The communications service system 104 can process the content received from the one or more participant devices 102 and output the processed content, such as the processed audio signals and/or video signals 110, to one or more output devices 106.

The participant device 102 can be, for example, any type of device, such as a laptop, a desktop computer, a portable computing device, a smart phone, a tablet, etc. The participant device 102 can include a plurality of input devices 103A-C, such as a built-in microphone or a built-in webcam, and can also be attached to external input devices 103A-C. The external input devices 103A-C can be, for example, an external microphone 103A, a headset 103B, and an external webcam 103C. The participant device 102 can generate an input signal based on its built-in input devices and/or based on any of the external input devices 103A-C. The output device 106 can be a laptop, as illustrated in FIG. 1B, and can also be any other device configured to output a content signal. For example, the output device 106 can be a speaker, such as a wireless smart speaker, a phone, such as a smartphone, and/or a display, such as a television, monitor, projector, etc.

The participant device 102 includes an input signal quality determination component 155A that can objectively determine the quality of an input signal received from an input device. The input signal quality determination component 155A can determine the quality of an input signal by determining an amplitude, a signal-to-noise ratio, reverberation, an echo, a voice naturalness, or a muffle of the input signal. The input signal quality determination component 155A can also determine the quality of an input signal by analyzing the shape of the signal, the digitization of the signal, the framerate of the signal, the bit rate of the signal, etc. The input signal quality determination component 155A can also monitor the quality of the input signal throughout the duration of the network session. In this way, a change in the quality of the input signal can be detected by the input signal quality determination component 155A. For example, the input signal quality determination component 155A can compare the signal-to-noise ratio of the input signal to a predetermined threshold and determine that, following the start of the network session, the signal-to-noise ratio of the input signal no longer satisfies the predetermined threshold, thereby indicating a low or unacceptable quality signal.

Although objective quality measurements are described above, the input signal quality determination component 155A can also determine subjective feedback. The participant device 102 may request feedback from the users orally or via a graphical user interface to determine whether the quality of output signal 110 is high or low, or acceptable or not acceptable, thereby indicating the quality of the input signal. In some embodiments, the participant device 102 may also request the level of quality of the output signal 110 using, for example, a ranking of one through ten. The subjective feedback from the participant in the network session can also be received orally. For example, a participant in the network session may state that the content has broken up or cannot be heard, thereby indicating a low quality or unacceptable input signal.

The determination of the quality of the input signal can also be based on both objective measures and subjective feedback. For example, the objective measures and the subjective feedback can be combined using, for example, a weighted sum or other heuristics. In some embodiments, artificial intelligence or a machine learning algorithm can be applied by the input signal quality determination component 155A to determine the quality of the input signal. The artificial intelligence or machine learning algorithm can be trained based on historical input signals and data indicating acceptable or unacceptable quality.

The determination of the quality of the input signal 108 can also be based on the detection of unsavory sounds. Unsavory sounds can include background noise, such as crowd noise, animal noise, other folks speaking, construction noise, road noise, etc. The quality of the input signal can be inversely proportional to the magnitude of unsavory sounds, such that the greater the magnitude of unsavory sounds, the lower the quality of the input signal. The identification of unsavory sounds can be based on a sound detection module.

The participant device 102 also includes an input device selection component 155B that can automatically select an input device used to capture content associated with the participant, such as speech or video of the participant in the network session, based on the quality of the input signal with or without human intervention. If the input signal quality determination component 155A indicates that the input signal is unacceptable or of low quality, then a change in the input device is initiated. The input device selection component 155B can then compare the quality of each input signal received from the input signal quality determination component 155A to determine the input device providing the highest quality input signal. For example, the input device selection component 155B can compare the signal-to-noise ratio of the various input signals from the participant device 102 and the external input devices 103A-C to determine which input device provides the highest quality input signal. That device can then be selected to provide the input signal 108 for use in the network session. In some embodiments, the input device that provides the highest quality input signal can be set as a selected input device for the participant.

The participant device 102 includes an input signal composite processing component 155C. If the input signal quality determination component 155A indicates that the input signal 108 is unacceptable or of low quality, instead of or in addition to changing the input device, the input signal composite processing component 155C can combine the various input signals received from the participant device 102 and the external input devices 103A-C to generate a composite input signal having a higher quality that an any of the individual input signals. To combine the various input signals, speech levels in a plurality of input signals can be normalized and then aligned to generate the composite input signal. In some embodiments, the input signal composite processing component 155C may incorporate a learning model, such as a machine learning model or a neural network, can be used to combine the plurality of input signals to generate the higher quality composite input signal.

The participant device 102 may include one or more components 155A-C for processing the one or more input signals received from the participant device 102 and for switching the input device. Although three components 155A-C are shown in FIG. 1B, the participant device 102 can include any number of components. The components 155A-C can process the one or more input signals and the communications service system 104 can then send the processed content signal 110 to the one or more output devices 106 simultaneously.

In an embodiment, the communications service system 104 may be implemented on one or more backend servers in the context of the Web services framework. Note, however, that one or more components of the communications service system 104 may be implemented on one or more of the frontend servers. In an embodiment, the communications service system 104 may be exposed as a Web service via a Web service interface that other entities may leverage to perform content processing services, applications, etc.

Embodiments of the communications service system 104 may be implemented according to an architecture that is linearly scalable. Embodiments may be scaled quickly and easily with little or no risk of losing usage information, with minimum or no downtime, and without affecting the latency of the overall system.

Figure 2:
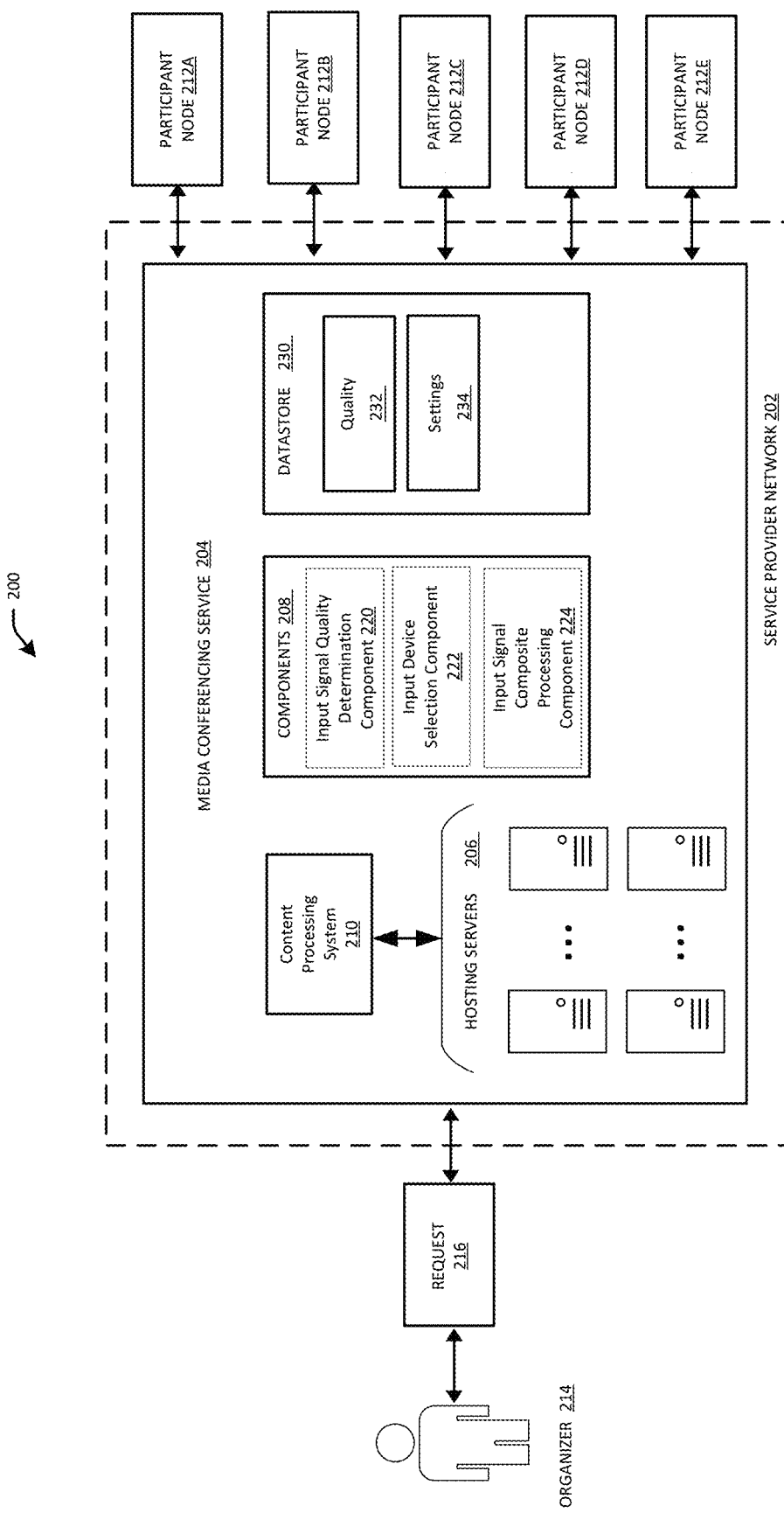
FIG. 2 schematically illustrates a system-architecture diagram of an example service provider network that provides a media conferencing service.

FIG. 2 schematically illustrates an example environment 200 that includes a service provider network 202. The service provider network 202 provides various services to users, such as participant nodes 212A-E, which can be the one or more participant devices 102 or the one or more output devices 106, or systems including the one or more participant devices 102 or the one or more output devices 106. The participant nodes 212A-E may also be referred to as computing nodes. The service provider network 202 can include various types of computing resources, such as data processing resources like data storage resources, networking resources, data communication resources, network services, and the like. Common expressions associated with the service provider network may include, for example, "on-demand computing," "software as a service (Saas)," "cloud services," "data centers," and so forth. Services provided by the service provider network 202 may be distributed across one or more physical or virtual devices.

In the example environment 200, the service provider network 202 includes a media conferencing service 204, such as an audio or video conferencing service. The media conferencing service 204 may include multiple hosting servers 206. In some embodiments, the media conferencing service 204 also includes components 208, a content processing system 210, and a datastore 230. The media conferencing service 204 may facilitate initiation of the media conference or may otherwise allow the media conference to take place via hosting servers 206.

Multiple participant nodes 212A-E are illustrated in the example environment 200. The participant nodes 212A-E represent computing nodes, participants, input devices, output devices, clients, bots, and/or users for media conferences provided by the media conferencing service 204. For example, each of the participant nodes 212A-E can be a participant device 102 or an output device 106, or systems including the participant device 102 or the output device 106. The participant nodes 212A-E interact with the media conferencing service 204 and the hosting servers 206 via electronic devices such as, for example, smart phones, tablets, laptop computers, desktop computers, telephones, etc. In some embodiments, at least one of the participant nodes 212A-E maybe a bot that is configured to interact in the video conference instead of a human participant. In configurations, the media conferences may comprise text, audio, and/or video, e.g., one or more of the participant nodes 212A-E may participate in a media conference that includes both audio and video. Text, audio, and/or video content can be sent between the participant nodes 212A-E via the media conferencing service 204. The media conference may be part of a gaming platform.

When one or more of the participant nodes 212A-E wishes to participate in a media conference, an organizer 214 of the media conference may send a request 216 for the media conference to the media conferencing service 204. The organizer 214 may also be a participant in the media conference. Content processed by the media conferencing service 204 can be broadcast to one or more of the participant nodes 212A-E simultaneously.

The input signal quality determination component 220 can correspond to the input signal quality determination component 105A, the input device selection component 222 can correspond to the input device selection component 105B, and the input signal composite processing component 224 can correspond to the input signal composite processing component 105C. Information from the content processing system 210 can be sent to the datastore 230, or information can be sent from the datastore 230 to the content processing system 210. For example, the datastore 230) can include a quality metric database 232 received from the input signal quality determination component 220 and/or the participant nodes 212A-E, which may correspond to objective quality metrics and subjective feedback of the input signals. The datastore 230 can also include settings 234 for the selected input devices for the various participant nodes 212A-E, for the preferences for selecting the input device by the input device selection component 222, and for the preferences for generating the composite input signal by the input signal composite processing component 224. The quality 232 and the settings 234 may be stored in one or more databases stored on the datastore 230. In an embodiment, the quality 232 and the settings 234 may be partitioned into three or more partitions in the datastore 230 such that the quality 232 may be stored in one partition and the settings 234 may be stored in another partition.

Figure 3B:
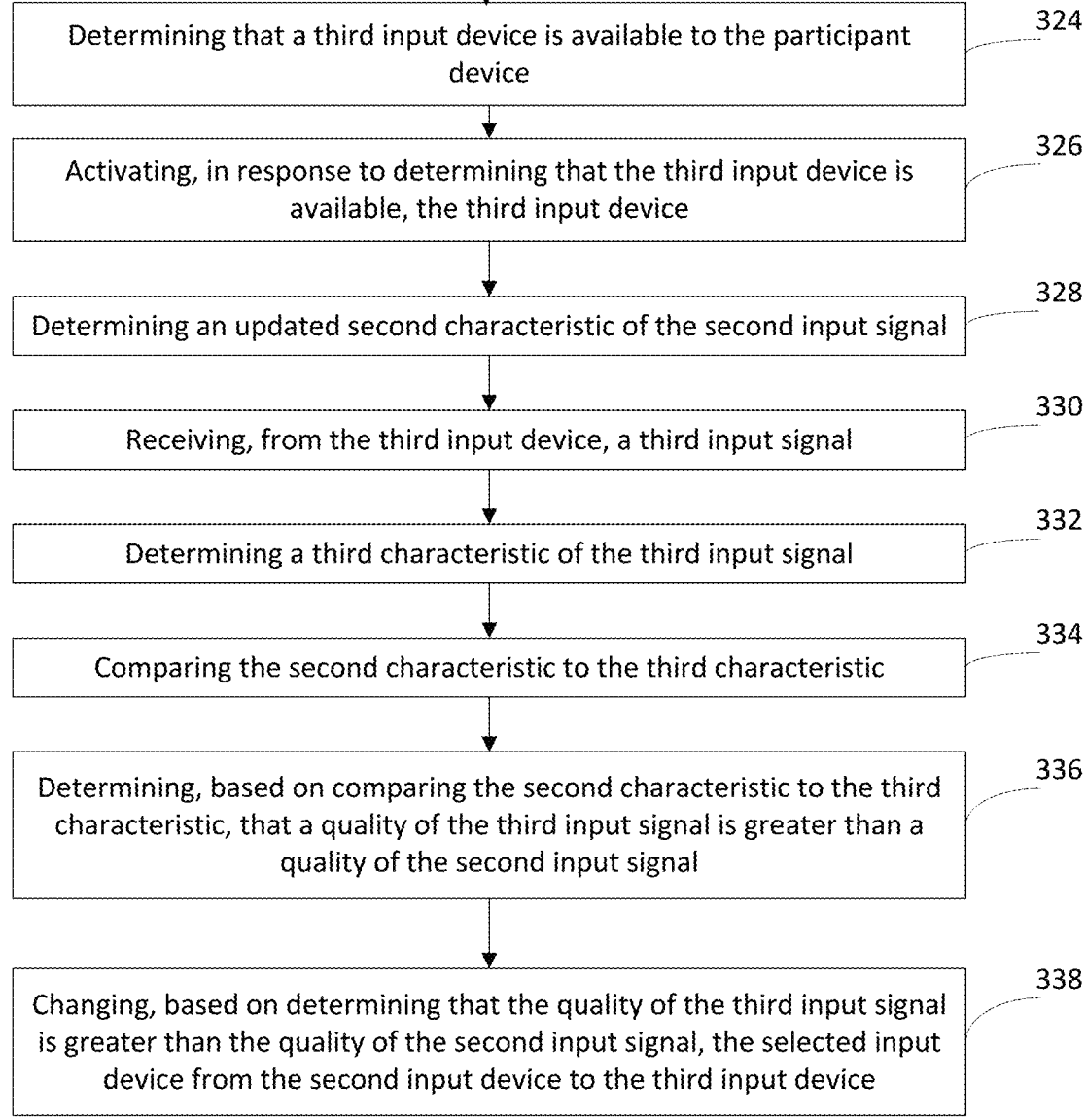

FIGS. 3A-B illustrate a flow diagram of an example method 300 that illustrates aspects of the functions performed at least partly by the service provider network 202. The logical operations described herein with respect to FIGS. 3A-B may be implemented (1) as a sequence of computer-implemented acts or program modules running on a computing system, and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIGS. 3A-B. and described herein. These operations can also be performed in parallel, or in a different order than those described herein. Some or all of these operations can also be performed by components other than those specifically identified. Although the techniques described in this disclosure are with reference to specific components, in other examples, the techniques may be implemented by less components, more components, different components, or any configuration of components.

The example method 300 may be implemented for selecting an input device providing a higher quality input signal than the currently selected input device. For example, the method 300 may be implemented to select the external microphone 103A to provide the input signal 108 instead of a built-in microphone of the participant device 102, for example, when the quality of the input signal 108 from the built-in microphone does not satisfy a predetermined threshold. In another example, the method 300 may be implemented to select a new input device, such as the external headset 103B when it is connected to the participant device 102 following the start of the media conference, if the quality of the input signal 108 from the external headset 103B is greater than the quality of the input signal 108 from the input device being used by the participant at the start of the media conference. In yet another example, the method 300 may be implemented to select a new input device upon determining that the current input device is no longer operating, such as by running out of battery power. Additionally, the method 300 may be implemented to configure the components 220 and 222 based on a determination that the input signal 108 does not satisfy the predetermined threshold.

At block 302, a media conference is initiated including a participant device participating in the media conference. The media conferencing service 204 establishes a media conference between the organizer 214 and one of more of the participant nodes 212A-E, or only between the participant nodes 212A-E. The media conference can be an audio conference, a video conference, a chat session, or a gaming session. The media conference can be established by the media conferencing service 204 in response to a request 216 from the organizer 214. The request 216 may include an identifier of the organizer 214, identifiers of the participant nodes 212A-E, a date, time, and/or duration for the media conference. The request 216 may also include an anticipated location for each participant node 212A-E.

At block 304, a first input device of the participant device 102 is selected as a selected input device in response to initiating the media conference. In some embodiments, the initial selected input device may be the last input device that is plugged into the participant device 102 or the input device that is built into the participant device 102. In some embodiments, the input device selection component 222 can choose the selected input device as the input device providing the highest quality input signal based on the quality determination of the input signal received from each input device of the participant device 102. In some embodiments, a participant associated with the participant device 102 can select the initial input device.

At block 306, a first input signal is received from the first input device. The first input signal can be received from the participant device 102, the external input device 103A-C. or the participant node 212A-C. The first input signal can be, for example, the input signal 108. The first input signal can transmit audio data or video data as part of the media conference. The first input signal may also include metadata regarding the input signal, such as an identifier of the input device, the device settings of the input device, a time at which the input signal was captured, etc.

At block 308, a first characteristic of the first input signal can be determined. The first characteristic can be determined by the input signal quality determination component 105A or the input signal quality determination component 220. The first characteristic can be indicative of the quality of the first input signal and can include one or more of, for example, an amplitude, a signal-to-noise ratio, reverberation, an echo, a voice naturalness, or a muffle of the first input signal. If the first input signal is a video signal, then the characteristic of the first input signal can be the color, clarity, frame rate, focus, encoding, etc., of the video signal. In some embodiments, the first characteristic of the first input signal can include subjective feedback received from the participants in the media conference, such as a rating or an oral expression indicating the quality of the output signal based on the first input signal. In some embodiments, the first characteristic of the first input signal can include both objective quality metrics and subjective feedback of the first input signal.

For example, the amplitude of the first input signal can be indicative of a gain setting of the first input device or a proximity of the participant to the first input device. The signal-to-noise ratio of the first input signal can be indicative of the level of a voice relative to the level of background noise in the first input signal. For example, a particular input device may include a background noise filter, resulting in an input signal with a higher signal-to-noise ratio than another input device that does not include a background noise filter. The difference between the signal-to-noise ratio of two such signals may be stark in a noisy environment, such as a public place or a construction site. Echo may be determined using, for example, a double talk detector or by determining a profile of the input and output devices connected to the participant device 102. For example, it may be determined that two external microphones 103A are connected to the participant device 102 and that the participant device 102 also includes an external speaker. Such a profile may be indicative of echo in the input signal.

Voice naturalness can be indicative of a listeners' perception of the degree to which speech meets the typical patterns of intonation, voice quality, rate, rhythm, and intensity, with respect to the syntactic structure of the utterance. Voice naturalness can be determined, for example, using a learning algorithm trained on prior speech data. Speech muffle can be determined based on the ratio of energy in the mid bands and the high bands of the voice signal, based on harmonics in the voice signal, and/or based on deviation from a voice model. Speech muffle can be determined, for example, using a learning algorithm trained on prior speech data.

In some embodiments, the first input signal may be sampled in order to reduce storage requirements and/or processing requirements for determining the first characteristic. For example, the first input signal may be sampled at a sampling frequency of 44100 hertz, or any other frequency suitable for calculating the first characteristic. In some embodiments, the sampling frequency can be different based on the type of the first characteristic. For example, if the first characteristic is amplitude, the sampling frequency maybe lower than if the first characteristic is voice naturalness, as a more accurate depiction of the first input signal may be required to accurately determine voice naturalness.

In some embodiments, the first characteristic of the first input signal can be based on a state of the input device. For example, a state of the input device can change from a first setting to a second setting. For example, the lid of a laptop may be closed, which would affect the muffle and amplitude of the voice of the participant. In such an example, the state of the input device may change from an open state to a closed state. In another example, a battery-powered device, such as a mobile phone, may switch from a normal state to a low-battery state. In such an example, the battery-powered device may turn off certain filters or lower the processing power of the battery-powered device, resulting in a lower quality input signal. The change of state of the input device can be determined based on metadata that can be received from the input device along with the input signal.

At block 310, the first characteristic of the first input signal can be determined not to satisfy a threshold. For example, an amplitude or a signal-to-noise ratio of the first input signal can be determined to be below a predetermined threshold. The predetermined threshold can be selected based on past perception of participants in media conferences. For example, if the media conferencing service 204 determines that participants have difficulty perceiving voice below a particular amplitude or signal-to-noise ratio based on subjective feedback from participants in prior media conferences, that particular amplitude or signal-to-noise ratio can be set as the predetermined threshold. In some embodiments, the step of determining whether the first input signal does not satisfy the threshold can be optional, as input signals from all of the input devices 103A-C can be received continuously and compared to one another to determine the input device providing the highest signal quality.

In another example, the echo present within the first input signal can be above a predetermined threshold. In yet another example, the voice naturalness or voice muffle may not satisfy a predetermined threshold by being below a predetermined threshold. In some embodiments where the first characteristic is subjective feedback from participants in the media conference, the first characteristic may not satisfy a predetermined threshold when participants indicate that the content quality of the media conference is unacceptable or below a predetermined rating.

The first characteristic of the first input signal can change during a media conference. For example the first characteristic of the first input signal can satisfy the threshold at the start of the media conference whereas the first characteristic of the first input signal may not satisfy the threshold at a later point during the media conference. As a particular example, the amplitude of the first input signal may be greater than a predetermined threshold at the start of immediate session when a participant is sitting at a desk within close proximity of the participant device 102. However, if the participant moves during the media conference, the proximity of the user to the participant device 102 may change, resulting in a decrease in amplitude to below the predetermined threshold. In another example, if the input device is mobile device, the participant can move from a controlled office setting at the start of the media conference to an outdoor environment including significant background noise. The media conferencing service 204 can improve the media conference experience for all of the participants in the media conference by switching the first or selected input device when the first characteristic of the input first input signal no longer satisfies the threshold.

The first characteristic of the first input signal may also not satisfy the threshold when the first input device stops transmitting the first input signal. For example, if the first input device is a battery-powered input device, the first input device may run out of power during the course of the media conference. In such a case, the first input signal will be terminated and not able to satisfy the quality threshold. In another example, the first input device may accidentally be turned off. Again, in such a case, the first input signal will be terminated and not able to satisfy the quality threshold.

At block 312, a second input device may be activated in response to determining that the first characteristic of the first input signal does not satisfy the threshold. Activating an input device may involve turning on the input device, changing a state of the input device, requesting the input device to capture a signal, or the like. In some embodiments, only the first or selected input device maybe active during a media conference to prevent echo in the media conference and/or to conserve power. In order to determine another input device available to the participant that provides a higher quality input signal, the media conferencing service 204 may, via the input signal quality determination component 220, activate some or all of the input devices 103A-C connected to the participant device 102. For example, if the external microphone 103A is the first input device, the headset 103B and a microphone that is part of the webcam 103C may be activated by the media conferencing service 204 in response to determining that the first characteristic of the first input signal does not satisfy the threshold. This activation maybe for a predetermined duration that is long enough to enable determination of the quality of the input signals from the activated input devices by the input signal quality determination component 220.

At block 314, a second input signal is received from the one or more second input devices. The second input signal can be received from the participant device 102, the external input device 103A-C, or the participant node 212A-C that is different from the first input device. The second input signal can be, for example, the input signal 108. The second input signal can transmit audio data or video data as part of the media conference. The second input signal can be received simultaneously with the first input signal to capture the same content from the participant of the media conference. The second input signal may also include metadata regarding the input signal, such as an identifier of the input device, the device settings of the input device, a time at which the input signal was captured, etc.

At block 316, a second characteristic of the second input signal can be determined. The second characteristic can be determined by the input signal quality determination component 105A or the input signal quality determination component 220. The second characteristic can be indicative of the quality of the input signal and can include one or more of, for example, an amplitude, a signal-to-noise ratio, reverberation, an echo, a voice naturalness, or a muffle of the second input signal. If the second input signal is a video signal, then the second characteristic of the second input signal can be the color, clarity, frame rate, focus, encoding, etc., of the video signal. In some embodiments, the second characteristic of the second input signal can include subjective feedback received from the participants in the media conference, such as a rating or an oral expression indicating the quality of the output signal based on the second input signal. In some embodiments, the second characteristic of the second input signal can include both objective quality metrics and subjective feedback of the second input signal.

For example, the amplitude of the second input signal can be indicative of a gain setting of the second input device or a proximity of the participant to the second input device. The signal-to-noise ratio of the second input signal can be indicative of the level of a voice relative to the level of background noise in the second input signal. For example, a particular input device may include a background noise filter, resulting in an input signal with a higher signal-to-noise ratio than another input device that does not include a background noise filter. The difference between the signal-to-noise ratio of two such signals may be stark in a noisy environment, such as a public place or a construction site. Echo may be determined using, for example, a double talk detector or by determining a profile of the input and output devices connected to the participant device 102. For example, it may be determined that two external microphones 103A are connected to the participant device 102 and that the participant device 102 also includes an external speaker. Such a profile may be indicative of echo in the input signal.

Voice naturalness can be indicative of a listeners' perception of the degree to which speech meets the typical patterns of intonation, voice quality, rate, rhythm, and intensity, with respect to the syntactic structure of the utterance. Voice naturalness can be determined, for example, using a learning algorithm trained on prior speech data. Speech muffle can be determined based on the ratio of energy in the mid bands and the high bands of the voice signal, based on harmonics in the voice signal, and/or based on deviation from a voice model. Speech muffle can be determined, for example, using a learning algorithm trained on prior speech data.

In some embodiments, the second input signal may be sampled in order to reduce storage requirements and/or processing requirements for determining the second characteristic. For example, the second input signal may be sampled at a sampling frequency of 44100 hertz, or any other frequency suitable for calculating the second characteristic. In some embodiments, the sampling frequency can be different based on the type of the second characteristic. For example, if the second characteristic is amplitude, the sampling frequency maybe lower than if the second characteristic is voice naturalness, as a more accurate depiction of the second input signal may be required to accurately determine voice naturalness.

In some embodiments, the second characteristic of the second input signal can be based on a state of the input device. For example, a state of the input device can change from a first setting to a second setting. For example, the lid of a laptop may be closed, which would affect the muffle and amplitude of the voice of the participant. In such an example, the state of the input device may change from an open state to a closed state. In another example, a battery-powered device, such as a mobile phone, may switch from a normal state to a low-battery state. In such an example, the battery-powered device may turn off certain filters or lower the processing power of the battery-powered device, resulting in a lower quality input signal. The change of state of the input device can be determined based on metadata that can be received from the input device along with the input signal.

At block 318, the first characteristic can be compared to the second characteristic to determine which input signal is higher quality. For example, the same type of characteristic of the first input signal and the second input signal can be compared to determine which input signal is higher quality. In another example, a plurality of characteristics of the first input signal and the second input signal can be compared to determine which input signal is higher quality. The plurality of characteristics can be combined using, for example, a weighted sum for comparison. For example, a quality score can be determined based on a plurality of the amplitude, the signal-to-noise ratio, reverberation, the echo, the voice naturalness, or the muffle of each input signal. In some embodiments, the quality score can be determined based on a learning algorithm, such as a neural network or machine learning algorithm.

At block 320, a quality of the second input signal can be determined to be greater than a quality of the first input signal based on comparing the first characteristic to the second characteristic. For example, if the common characteristic between the first input signal and the second input signal is amplitude, the input signal having the greatest amplitude can be determined to be higher quality. The greater amplitude of the second input signal can be due to movement of the participant of the media conference such that the proximity of the participant can be closer to the second input device then the first input device over time. If the characteristic is voice muffle, the input signal having the least voice muffle can be determined to be higher quality. If a plurality of characteristics are considered, the quality score for each of the first input signal and the second input signal can be compared to determine which input signal is higher quality. In some embodiments, a learning algorithm, such as a neural network or machine learning algorithm, can be used to determined that the quality of the second input signal is greater than the quality of the first input signal. The learning algorithm can be trained based on quality characteristics of input signals in prior media conferences.

At block 322, the selected input device can be changed from the first input device to the second input device based on determining that the quality of the second input signal is greater than the quality of the first input signal. For example, the input device selection component 222 of the media conferencing service 204 can be running in the background of the media conference to continuously select the input device having the highest quality. Once an input device having a higher quality is determined, the input device selection component 222 can send a notification to the participant that a change in input device is recommended. The notification of the change in input device can be a visual notification, an audible notification, and/or a tactile notification. Upon acceptance of the notification, the input device can be changed by the input device selection component 222 to the higher quality input device. In some embodiments, the input device selection component 222 can change the input device automatically without further intervention from the participant of the media conference.

In some embodiments, the selected input device can be changed to the second input device if the difference in quality between the first input signal and the second input signal is greater than a predetermined threshold. As such, an insignificant increase in quality of the second input signal may not necessitate a change of the selected input device to the second input device.

In some embodiments where the quality of the input signals of the plurality of input devices is continuously being monitored, the quality of the input signals over a predetermined time period can be used to change the selected input device. For example, if the quality of a particular input signal is sinusoidal over time, the input device associated with the sinusoidal input signal can be selected as the selected input signal only during the periods of high quality. In another example, the quality of the sinusoidal input signal can be determined to be an average quality over a predetermined time period. In some embodiments, it may be known that the quality of a particular input device increases during certain times of the day based on the historical quality measurements. For example, if the input device is a mobile device, it may be determined that the quality of the input signal from the mobile device is lower during commuting hours to and from work than during business hours when the participant of the media conference is in a controlled environment, such as an office. In such an embodiment, the mobile device may be set as the selected input device during business hours but another input device, such as a car microphone including advanced noise cancellation filters, may be set as the selected input device during commuting hours.

At block 324, the participant device 102 or the communications service system 104 may determine that a new input device 103, such as a third input device, is available. For example, a new external microphone, external headset, or external webcam may be attached to the participant device 102 following the start of the media session. The determination of the new input device may be based on metadata received with the input signal 108, based on a change in a configuration setting of the participant device 102, or based on a tracker of the communication service system 104.

At block 326, the third input device may be activated in response to determining that the third input device is available to the participant device 102. Activating the third input device may involve turning on the third input device, changing a state of the third input device, requesting the third input device to capture a signal, or the like. This activation maybe for a predetermined duration that is long enough to enable determination of the quality of the input signals from the activated input devices by the input signal quality determination component 220.

At block 328, an updated second characteristic of the second input signal can be determined. The updated second characteristic can be determined by the input signal quality determination component 105A or the input signal quality determination component 220 at a time that is after the determination of the second characteristic of the second input signal in step 316. The updated second characteristic can be indicative of the quality of the second input signal and can include one or more of, for example, an amplitude, a signal-to-noise ratio, reverberation, an echo, a voice naturalness, or a muffle of the second input signal. If the second input signal is a video signal, then the updated second characteristic of the second input signal can be the color, clarity, frame rate, focus, encoding, etc., of the video signal. In some embodiments, the updated second characteristic of the second input signal can include subjective feedback received from the participants in the media conference, such as a rating or an oral expression indicating the quality of the output signal based on the second input signal. In some embodiments, the updated second characteristic of the second input signal can include both objective quality metrics and subjective feedback of the second input signal.

At block 330, a third input signal is received from the third input device. The third input signal can be received from the participant device 102, the external input device 103A-C, or the participant node 212A-C. The third input signal can be, for example, the input signal 108. The third input signal can transmit audio data or video data as part of the media conference. The third input signal may also include metadata regarding the input signal, such as an identifier of the input device, the device settings of the input device, a time at which the input signal was captured, etc.

At block 332, a third characteristic of the third input signal can be determined. The third characteristic can be determined by the input signal quality determination component 105A or the input signal quality determination component 220. The third characteristic can be indicative of the quality of the third input signal and can include one or more of, for example, an amplitude, a signal-to-noise ratio, reverberation, an echo, a voice naturalness, or a muffle of the first input signal. If the third input signal is a video signal, then the characteristic of the third input signal can be the color, clarity, frame rate, focus, encoding, etc., of the video signal. In some embodiments, the third characteristic of the third input signal can include subjective feedback received from the participants in the media conference, such as a rating or an oral expression indicating the quality of the output signal based on the third input signal. In some embodiments, the third characteristic of the third input signal can include both objective quality metrics and subjective feedback of the third input signal.

In some embodiments, the third characteristic of the third input signal can be based on a state of the input device. For example, a state of the input device can change from a first setting to a second setting. The change of state of the input device can be determined based on metadata that can be received from the input device along with the input signal.

At block 334, the second characteristic can be compared to the third characteristic to determine which input signal is higher quality. For example, the same type of characteristic of the second input signal and the third input signal can be compared to determine which input signal is higher quality. In another example, a plurality of characteristics of the second input signal and the third input signal can be compared to determine which input signal is higher quality. The plurality of characteristics can be combined using, for example, a weighted sum for comparison. For example, a quality score can be determined based on a plurality of the amplitude, the signal-to-noise ratio, reverberation, the echo, the voice naturalness, or the muffle of each input signal. In some embodiments, the quality score can be determined based on a learning algorithm, such as a neural network or machine learning algorithm.

At block 336, a quality of the third input signal can be determined to be greater than a quality of the second input signal based on comparing the second characteristic to the third characteristic. For example, if the common characteristic between the second input signal and the third input signal is amplitude, the input signal having the greatest amplitude can be determined to be higher quality. If the characteristic is voice muffle, the input signal having the least voice muffle can be determined to be higher quality. If a plurality of characteristics are considered, the quality score for each of the second input signal and the third input signal can be compared to determine which input signal is higher quality. In some embodiments, a learning algorithm, such as a neural network or machine learning algorithm, can be used to determined that the quality of the third input signal is greater than the quality of the second input signal.

At block 338, the selected input device can be changed from the second input device to the third input device based on determining that the quality of the third input signal is greater than the quality of the second input signal. For example, the input device selection component 222 of the media conferencing service 204 can be running in the background of the media conference to continuously select the input device having the highest quality. Once an input device having a higher quality is determined, the input device selection component 222 can send a notification to the participant that a change in input device is recommended. The notification of the change in input device can be a visual notification, an audible notification, and/or a tactile notification. Upon acceptance of the notification, the input device can be changed by the input device selection component 222 to the higher quality input device. In some embodiments, the input device selection component 222 can change the input device automatically without further intervention from the participant of the media conference.

Figure 4:
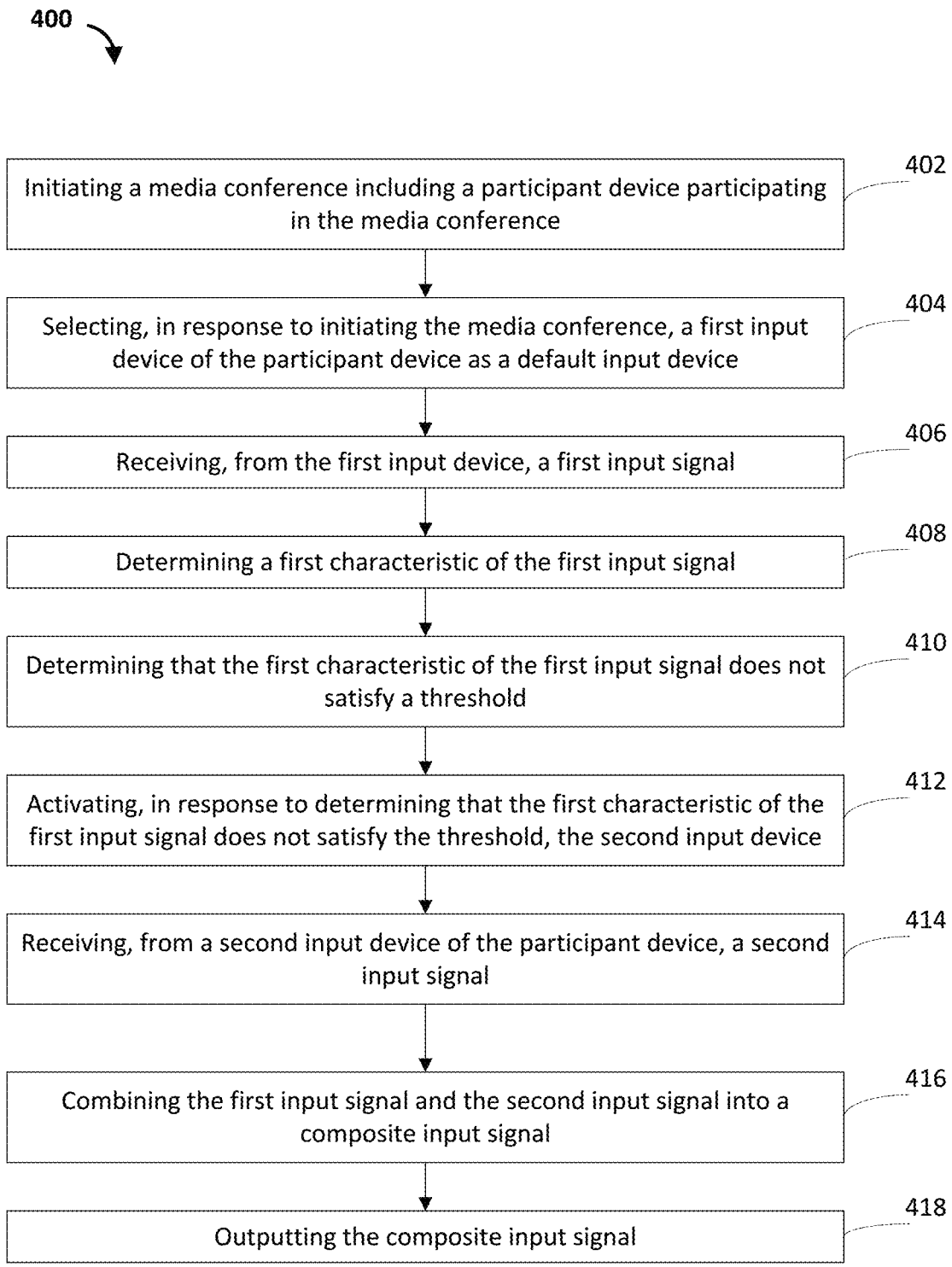
FIG. 4 is a flowchart showing an example process for combining a plurality of input signals to generate a composite input signal having higher quality.

FIG. 4 illustrates a flow diagram of an example method 400 that illustrates aspects of the functions performed at least partly by the service provider network 202. The logical operations described herein with respect to FIG. 4 may be implemented (1) as a sequence of computer-implemented acts or program modules running on a computing system, and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIG. 4, and described herein. These operations can also be performed in parallel, or in a different order than those described herein. Some or all of these operations can also be performed by components other than those specifically identified. Although the techniques described in this disclosure are with reference to specific components, in other examples, the techniques may be implemented by less components, more components, different components, or any configuration of components.

The example method 400 may be implemented for combining a plurality of input signals to generate a composite input signal having higher quality according to another embodiment. For example, the method 400 may be implemented to configure the input signal composite processing component 105C and the input signal composite processing component 224 when the quality of the input signal 108 from the built-in microphone does not satisfy a predetermined threshold. Additionally, the method 400 may be implemented to configure the components 105C and 224 based on a determination that the input signal 108 does not satisfy a predetermined threshold.

At block 402, a media conference is initiated including a participant device participating in the media conference. The media conferencing service 204 establishes a media conference between the organizer 214 and one of more of the participant nodes 212A-E. or only between the participant nodes 212A-E. The media conference can be an audio conference, a video conference, a chat session, or a gaming session. The media conference can be established by the media conferencing service 204 in response to a request 216 from the organizer 214. The request 216 may include an identifier of the organizer 214, identifiers of the participant nodes 212A-E, a date, time, and/or duration for the media conference. The request 216 may also include an anticipated location for each participant node 212A-E.

At block 404, a first input device of the participant device 102 is selected as a selected input device in response to initiating the media conference. In some embodiments, the initial selected input device may be the last input device that is plugged into the participant device 102 or the input device that is built into the participant device 102. In some embodiments, the input device selection component 222 can choose the selected input device as the input device providing the highest quality input signal based on the quality determination of the input signal received from each input device of the participant device 102. In some embodiments, a participant associated with the participant device 102 can select the selected input device.

At block 406, a first input signal is received from the first input device. The first input signal can be received from the participant device 102, the external input device 103A-C. or the participant node 212A-C. The first input signal can be, for example, the input signal 108. The first input signal can transmit audio data or video data as part of the media conference. The first input signal may also include metadata regarding the input signal, such as an identifier of the input device, the device settings of the input device, a time at which the input signal was captured, etc.

At block 408, a first characteristic of the first input signal can be determined. The first characteristic can be determined by the input signal quality determination component 105A or the input signal quality determination component 220. The first characteristic can be indicative of the quality of the first input signal and can include one or more of, for example, an amplitude, a signal-to-noise ratio, reverberation, an echo, a voice naturalness, or a muffle of the first input signal. If the first input signal is a video signal, then the characteristic of the first input signal can be the color, clarity, frame rate, focus, encoding, etc., of the video signal. In some embodiments, the first characteristic of the first input signal can include subjective feedback received from the participants in the media conference, such as a rating or an oral expression indicating the quality of the output signal based on the first input signal. In some embodiments, the first characteristic of the first input signal can include both objective quality metrics and subjective feedback of the first input signal.

For example, the amplitude of the first input signal can be indicative of a gain setting of the first input device or a proximity of the participant to the first input device. The signal-to-noise ratio of the first input signal can be indicative of the level of a voice relative to the level of background noise in the first input signal. For example, a particular input device may include a background noise filter, resulting in an input signal with a higher signal-to-noise ratio than another input device that does not include a background noise filter. The difference between the signal-to-noise ratio of two such signals may be stark in a noisy environment, such as a public place or a construction site. Echo may be determined using, for example, a double talk detector or by determining a profile of the input and output devices connected to the participant device 102. For example, it may be determined that two external microphones 103A are connected to the participant device 102 and that the participant device 102 also includes an external speaker. Such a profile may be indicative of echo in the input signal.

Voice naturalness can be indicative of a listeners perception of the degree to which speech meets the typical patterns of intonation, voice quality, rate, rhythm, and intensity, with respect to the syntactic structure of the utterance. Voice naturalness can be determined, for example, using a learning algorithm trained on prior speech data. Speech muffle can be determined based on the ratio of energy in the mid bands and the high bands of the voice signal, based on harmonics in the voice signal, and/or based on deviation from a voice model. Speech muffle can be determined, for example, using a learning algorithm trained on prior speech data.

In some embodiments, the first input signal may be sampled in order to reduce storage requirements and/or processing requirements for determining the first characteristic. For example, the first input signal may be sampled at a sampling frequency of 44100 hertz, or any other frequency suitable for calculating the first characteristic. In some embodiments, the sampling frequency can be different based on the type of the first characteristic. For example, if the first characteristic is amplitude, the sampling frequency maybe lower than if the first characteristic is voice naturalness, as a more accurate depiction of the first input signal may be required to accurately determine voice naturalness.

In some embodiments, the first characteristic of the first input signal can be based on a state of the input device. For example, a state of the input device can change from a first setting to a second setting. For example, the lid of a laptop may be closed, which would affect the muffle and amplitude of the voice of the participant. In such an example, the state of the input device may change from an open state to a closed state. In another example, a battery-powered device, such as a mobile phone, may switch from a normal state to a low-battery state. In such an example, the battery-powered device may turn off certain filters or lower the processing power of the battery-powered device, resulting in a lower quality input signal. The change of state of the input device can be determined based on metadata that can be received from the input device along with the input signal.

At block 410, the first characteristic of the first input signal can be determined not to satisfy a threshold. For example, an amplitude or a signal-to-noise ratio of the first input signal can be determined to be below a predetermined threshold. The predetermined threshold can be selected based on past perception of participants in media conferences. For example, if the media conferencing service 204 determines that participants have difficulty perceiving voice below a particular amplitude or signal-to-noise ratio based on subjective feedback from participants in prior media conferences, that particular amplitude or signal-to-noise ratio can be set as the predetermined threshold.

In another example, the echo present within the first input signal can be above a predetermined threshold. In yet another example, the voice naturalness or voice muffle may not satisfy a predetermined threshold by being below a predetermined threshold. In some embodiments where the first characteristic is subjective feedback from participants in the media conference, the first characteristic may not satisfy a predetermined threshold when participants indicate that the content quality of the media conference is unacceptable or below a predetermined rating.

The first characteristic of the first input signal can change during a media conference. For example the first characteristic of the first input signal can satisfy the threshold at the start of the media conference whereas the first characteristic of the first input signal may not satisfy the threshold at a later point during the media conference. As a particular example, the amplitude of the first input signal may be greater than a predetermined threshold at the start of immediate session when a participant is sitting at a desk within close proximity of the participant device 102. However, if the participant moves during the media conference, the proximity of the user to the participant device 102 may change, resulting in a decrease in amplitude to below the predetermined threshold. In another example, if the input device is mobile device, the participant can move from a controlled office setting at the start of the media conference to an outdoor environment including significant background noise. The media conferencing service 204 can improve the media conference experience for all of the participants in the media conference by switching the first or selected input device when the first characteristic of the input first input signal no longer satisfies the threshold.

The first characteristic of the first input signal may also not satisfy the threshold when the first input device stops transmitting the first input signal. For example, if the first input device is a battery-powered input device, the first input device may run out of power during the course of the media conference. In such a case, the first input signal will be terminated and not able to satisfy the quality threshold. In another example, the first input device may accidentally be turned off. Again, in such a case, the first input signal will be terminated and not able to satisfy the quality threshold.

At block 412, a second input device may be activated in response to determining that the first characteristic of the first input signal does not satisfy the threshold. Activating the second input device may involve turning on the second input device, changing a state of the second input device, requesting the second input device to capture a signal, or the like. In some embodiments, only the first or selected input device maybe active during a media conference to prevent echo in the media conference and/or to conserve power. In order to determine another input device available to the participant that provides a higher quality input signal, the media conferencing service 204 may, via the input signal quality determination component 220, activate some or all of the input devices 103A-C connected to the participant device 102. For example, if the external microphone 103A is the first input device, the headset 103B and a microphone that is part of the webcam 103C may be activated by the media conferencing service 204 in response to determining that the first characteristic of the first input signal does not satisfy the threshold. This activation maybe for a predetermined duration that is long enough to enable determination of the quality of the input signals from the activated input devices by the input signal quality determination component 220.

At block 414, a second input signal is received from the one or more second input devices. The second input signal can be received from the participant device 102, the external input device 103A-C, or the participant node 212A-C that is different from the first input device. The second input signal can be, for example, the input signal 108. The first input signal can transmit audio data or video data as part of the media conference. The second input signal can be received simultaneously with the first input signal to capture the same content from the participant of the media conference.

At block 416, the first input signal and the second input signal can be combined into a composite input signal that has a higher quality that the first input signal. In some embodiments, more than two input signals can be received and combined. For example, three, four, or more input signals can be received from the input devices 103A-C of the participant device 102 for combination into the composite input signal. The decision to combine the two or more input signals, or which of the three or more input signals to combine, can be based on the quality of the combined signal relative to the input signals. For example, if the combination of a first input signal and a second input signal has a higher quality than each of the first input signal and the second input signal, then the first input signal and the second input signal can be combined into a composite signal. In another example, if the combination of the first input signal and a third input signal has a higher quality than each of the first input signal, the second input signal, and the third input signal, then the first input signal and the third input signal can be combined into a composite input signal. The quality of the composite input signal and the input signals can be based on a characteristic of the signals as described in connection with step 408.

However, the plurality of input signals cannot merely be added together. Rather, at least the alignment, amplitude, and phase of the plurality of input signals must be accounted for in combining the plurality of input signals. For example, the speech levels of the plurality of input signals can be normalized, the speech in the plurality of input signals can be aligned, the position of video content within the plurality of input signals can be aligned, and/or the phase of the plurality of input signals can be corrected. As such, the position of the participant relative to the input devices and a time offset between the input signals can be accounted for in combining the plurality of input signals.

In some embodiments, a learning algorithm can be used to combine the plurality of input signals. For example, a neural networking algorithm trained based on prior input signals can be used to generate the composite input signal based on the plurality of input signals. In some embodiments, blind signal separation can be used to combine the plurality of input signals.

Figure 6:
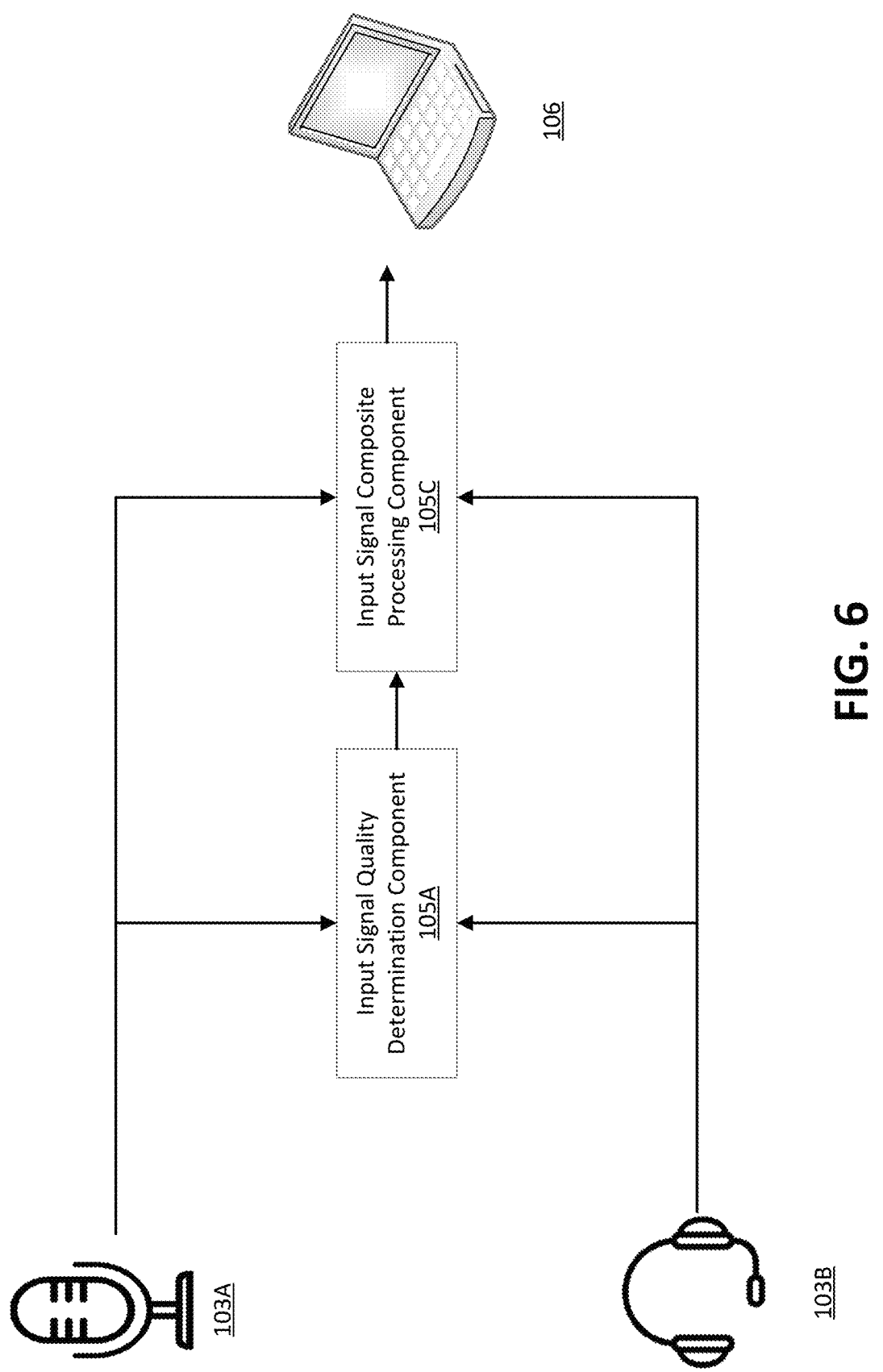
FIG. 6 schematically illustrates combining the plurality of input signals to generate the composite input signal.

FIG. 6 illustrates an example computing environment for combining a plurality of input signals into a composite input signal. A microphone 103A provides a first input signal and a headset 103B provides a second input signal. The input signal composite processing component 105C combines the first input signal and the second input signal, and possibly additional input signals, to generate the composite input signal, as described above in connection with block 416. The composite input signal can then be output to an output device, such as a laptop 106, as described below in connection with block 418.

In addition, as described above in connection with blocks 308 and 316, a first characteristic of the first input signal can be determined and a second characteristic of the second input signal can be determined by the input signal quality determination component 105A. In some embodiments, the first input signal and the second input signal can be combined in a weighted manner based on the quality of each input signal such that the greater the characteristic or quality of the input signal, the greater the weight associated with that input signal in generating the composite input signal. As such, if it is determined that the first characteristic of the first input signal is greater than the first characteristic of the second input signal, then the proportion of the first input signal can be greater relative to the second input signal in generating the composite input signal. For example, if it is determined that the amplitude or the signal-to-noise ratio of the first input signal is greater than the amplitude or signal-to-noise ratio of the second input signal, then the proportion of the first input signal can be greater relative to the second input signal in generating the composite input signal.

At block 418, the composite input signal is output. In some embodiments, the composite input signal can be processed using one or more filters or components of the media conferencing service 204. For example, the composite input signal can be encoded to lower the bandwidth required to transmit the composite input signal. In another example, the composite input signal can be filtered to remove noise, reverberation, echo, improve speech, improve color, increase or decrease frame rate, increase or decrease resolution, etc. The composite input signal can be sent to one or more output devices, such as the one or more output devices 106 or broadcast to the participant nodes 212A-E.

Figure 5:
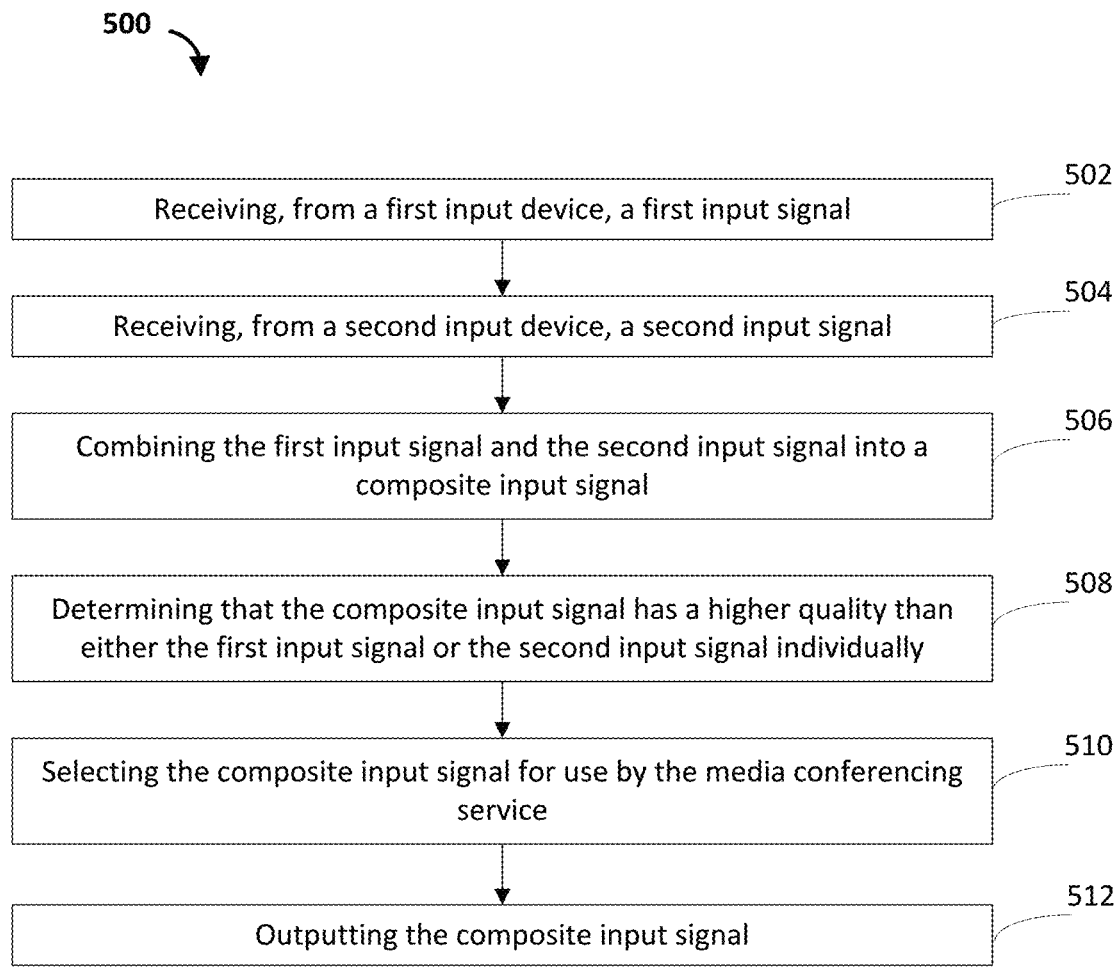
FIG. 5 is a flowchart showing another example process for combining a plurality of input signals to generate a composite input signal having higher quality.

FIG. 5 illustrates a flow diagram of another example method 500) that illustrates aspects of the functions performed at least partly by the service provider network 202. The logical operations described herein with respect to FIG. 5 may be implemented (1) as a sequence of computer-implemented acts or program modules running on a computing system, and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIG. 5, and described herein. These operations can also be performed in parallel, or in a different order than those described herein. Some or all of these operations can also be performed by components other than those specifically identified. Although the techniques described in this disclosure are with reference to specific components, in other examples, the techniques may be implemented by less components, more components, different components, or any configuration of components.

The example method 500 may be implemented for combining a plurality of input signals to generate a composite input signal having higher quality according to another embodiment. For example, the method 500 may be implemented to configure the input signal composite processing component 105C and the input signal composite processing component 224 when the quality of a composite signal is greater than the quality of any one input signal 108.

Following initiation of a media conference, at block 502, a first input signal is received from a first input device. The first input signal can be received from the participant device 102, the external input device 103A-C, or the participant node 212A-C. The first input signal can be, for example, the input signal 108. The first input signal can transmit audio data or video data as part of the media conference. The first input signal may also include metadata regarding the first input signal, such as an identifier of the input device, the device settings of the input device, a time at which the input signal was captured, etc.

At block 504, a second input signal is received from second input device. The second input signal can be received from the participant device 102, the external input device 103A-C, or the participant node 212A-C. The second input signal can be, for example, the input signal 108. The second input signal can transmit audio data or video data as part of the media conference. The second input signal may also include metadata regarding the second input signal, such as an identifier of the input device, the device settings of the input device, a time at which the input signal was captured, etc.

At block 506, the first input signal and the second input signal can be combined into a composite input signal that may have a higher quality that the first input signal or the second input signal individually. In some embodiments, more than two input signals can be received and combined. For example, three, four, or more input signals can be received from the input devices 103A-C of the participant device 102 for combination into the composite input signal. However, the plurality of input signals cannot merely be added together. Rather, at least the alignment, amplitude, and phase of the plurality of input signals must be accounted for in combining the plurality of input signals. For example, the speech levels of the plurality of input signals can be normalized, the speech in the plurality of input signals can be aligned, the position of video content within the plurality of input signals can be aligned, and/or the phase of the plurality of input signals can be corrected. As such, the position of the participant relative to the input devices and a time offset between the input signals can be accounted for in combining the plurality of input signals.

In some embodiments, a learning algorithm can be used to combine the plurality of input signals. For example, a neural networking algorithm trained based on prior input signals can be used to generate the composite input signal based on the plurality of input signals. In some embodiments, blind signal separation can be used to combine the plurality of input signals.

At block 508, it can be determined that the composite input signal has a higher quality than either the first input signal or the second input signal individually. The quality of the composite input signal, the first input signal, and the second input signal can be based on one or more characteristics of each of the signals. The characteristics can be determined by the input signal quality determination component 105A or the input signal quality determination component 220. The characteristics can be indicative of the quality of the signals and can include one or more of, for example, an amplitude, a signal-to-noise ratio, reverberation, an echo, a voice naturalness, or a muffle of the input signal. If the input signals are a video signals, then the characteristics of the input signals can be the color, clarity, frame rate, focus, encoding, etc., of the video signal. In some embodiments, the characteristics of the signals can include subjective feedback received from the participants in the media conference, such as a rating or an oral expression indicating the quality of the output signal based on the first input signal. In some embodiments, the characteristics of the signals can include both objective quality metrics and subjective feedback.

The quality of the first input signal, the second input signal, and the composite input signal can change during a media conference. Therefore, the media conferencing service 204 can improve the media conference experience for all of the participants in the media conference by switching between the first input signal, second input signal, another input signal, and the composite input signal depending on the quality of the signals relative to one another.

At block 510, in response to determining that the composite input signal has a higher quality than either the first input signal or the second input signal individually, the composite input signal can be selected for use by the media conferencing service as part of the media conference.

At block 512, the composite input signal is output. In some embodiments, the composite input signal can be processed using one or more filters or components of the media conferencing service 204. For example, the composite input signal can be encoded to lower the bandwidth required to transmit the composite input signal. In another example, the composite input signal can be filtered to remove noise, reverberation, echo, improve speech, improve color, increase or decrease frame rate, increase or decrease resolution, etc. The composite input signal can be sent to one or more output devices, such as the one or more output devices 106 or broadcast to the participant nodes 212A-E.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in FIGS. 3A-5, and described herein. These operations can also be performed in parallel, or in a different order than those described herein. Some or all of these operations can also be performed by components other than those specifically identified. Although the techniques described in this disclosure are with reference to specific components, in other examples, the techniques may be implemented by less components, more components, different components, or any configuration of components.

Figure 7:
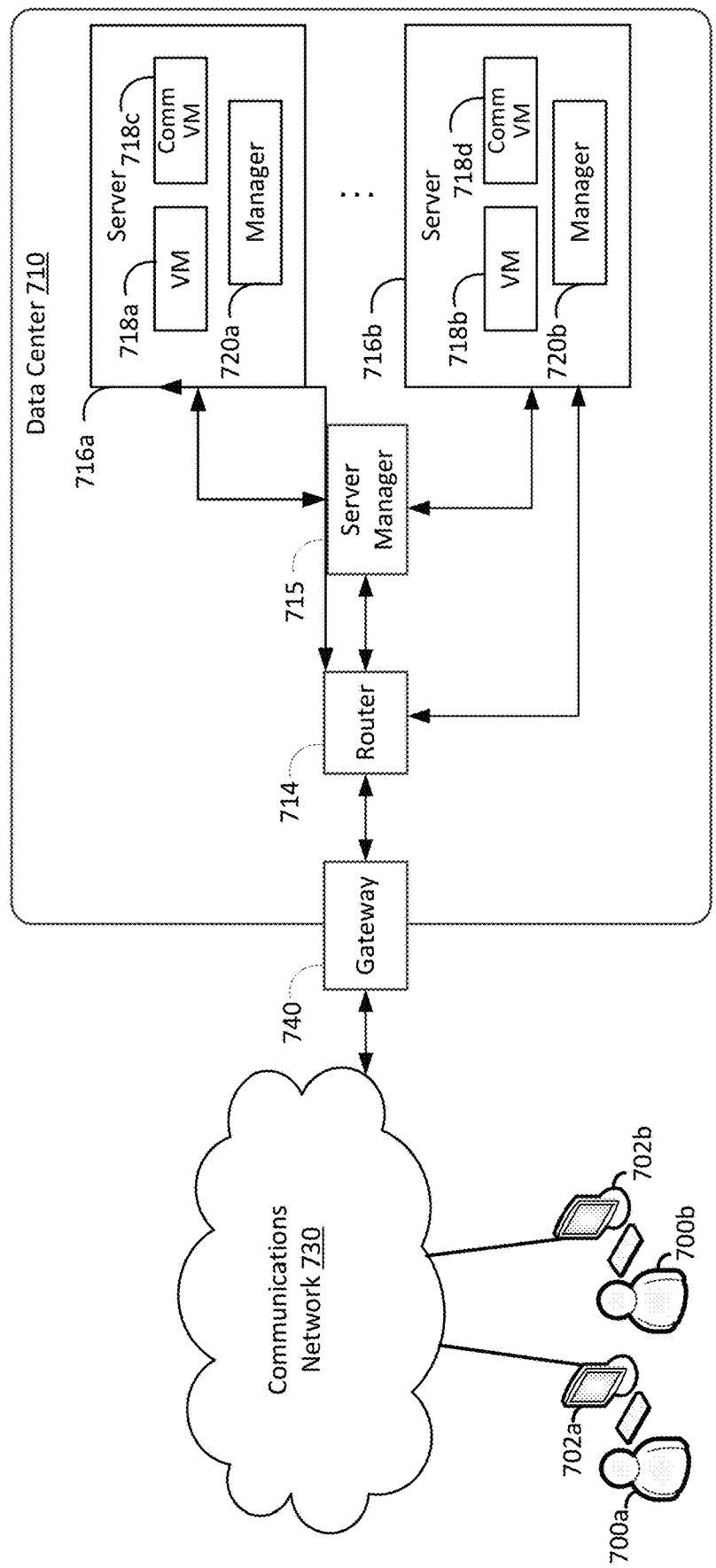
FIG. 7 is a diagram illustrating an example computing environment that may be used in some embodiments.

FIG. 7 illustrates an example computing environment in which the embodiments described herein may be implemented. The example computing environment of FIG. 7 may be configured to implement one or more of the services, such as the communications service system 104 of FIGS. 1A-B and/or the media conferencing service 204 of FIG. 2. The example computing environment of FIG. 7 may be configured to implement any of the methods described herein, such as any methods (e.g., or any operations) associated with FIGS. 3A-5.

FIG. 7 is a diagram schematically illustrating an example of a data center 710) that can provide computing resources to users 700a and 700b (which may be referred herein singularly as user 700 or in the plural as users 700) via user computers 702a and 702b (which may be referred herein singularly as computer 702 or in the plural as computers 702) via a communications network 730. Data center 710 may be configured to provide computing resources for executing applications on a permanent or an as-needed basis. The computing resources provided by data center 710 may include various types of resources, such as gateway resources, load balancing resources, routing resources, networking resources, computing resources, volatile and nonvolatile memory resources, content delivery resources, data processing resources, data storage resources, data communication resources, and the like. Each type of computing resource may be general-purpose or may be available in a number of specific configurations. For example, data processing resources may be available as virtual machine instances that may be configured to provide various web services. In addition, combinations of resources may be made available via a network and may be configured as one or more web services. The instances may be configured to execute applications, including web services, such as application services, media services, database services, processing services, gateway services, storage services, routing services, security services, encryption services, load balancing services, application services and the like. These web services may be configurable with set or custom applications and may be configurable in size, execution, cost, latency, type, duration, accessibility, and in any other dimension. These web services may be configured as available infrastructure for one or more clients and can include one or more applications configured as a platform or as software for one or more clients. These web services may be made available via one or more communications protocols. These communications protocols may include, for example, hypertext transfer protocol (HTTP) or non-HTTP protocols. These communications protocols may also include, for example, more reliable transport layer protocols such as transmission control protocol (TCP) and less reliable transport layer protocols such as user datagram protocol (UDP). Data storage resources may include file storage devices, block storage devices and the like.

Each type or configuration of computing resource may be available in different sizes, such as large resources-consisting of many processors, large amounts of memory and/or large storage capacity- and small resources-consisting of fewer processors, smaller amounts of memory and/or smaller storage capacity. Customers may choose to allocate a number of small processing resources as web servers and/or one large processing resource as a database server, for example.

Data center 710 may include servers 716a-b (which may be referred herein singularly as server 716 or in the plural as servers 716) that provide computing resources. These resources may be available as bare metal resources, or as virtual machine instances 718a-d and (which may be referred herein singularly as virtual machine instance 718 or in the plural as virtual machine instances 718). Virtual machine instances 718c and 718d can be communication service virtual machine. The communication service virtual machine instances 718c and 718d may be configured to perform all or any portion of the communication services (e.g., contact center services, virtual environment services, determining virtual features, facilitating communication sessions, content services for accessing virtual environments) in accordance with the present disclosure and described in detail herein. As should be appreciated, while the particular example illustrated in FIG. 7 includes one communication service virtual machine in each server, this is merely an example. A server may include more than one communication service virtual machine or may not include any communication service virtual machines.

The availability of virtualization technologies for computing hardware has provided benefits for providing large scale computing resources for customers and allowing computing resources to be efficiently and securely shared between multiple customers. For example, virtualization technologies may allow a physical computing device to be shared among multiple users by providing each user with one or more virtual machine instances hosted by the physical computing device. A virtual machine instance may be a software emulation of a particular physical computing system that acts as a distinct logical computing system. Such a virtual machine instance provides isolation among multiple operating systems sharing a given physical computing resource. Furthermore, some virtualization technologies may provide virtual resources that span one or more physical resources, such as a single virtual machine instance with multiple virtual processors that spans multiple distinct physical computing systems.

Referring to FIG. 7, communications network 730 may, for example, be a publicly accessible network of linked networks and possibly operated by various distinct parties, such as the Internet. In other embodiments, communications network 730 may be a private network, such as, a corporate or university network that is wholly or partially inaccessible to non-privileged users. In still other embodiments, communications network 730 may include one or more private networks with access to and/or from the Internet.

Communication network 730 may provide access to computers 702. User computers 702 may be computers utilized by users 700 or other customers of data center 710. For instance, user computer 702a or 702b may be a server, a desktop or laptop personal computer, a tablet computer, a wireless telephone, a personal digital assistant (PDA), an e-book reader, a game console, a set-top box or any other computing device capable of accessing data center 710. User computer 702a or 702b may connect directly to the Internet (e.g., via a cable modem or a Digital Subscriber Line (DSL)). Although only two user computers 702a and 702b are depicted, it should be appreciated that there may be multiple user computers.

User computers 702 may also be utilized to configure aspects of the computing resources provided by data center 710. In this regard, data center 710 might provide a gateway or web interface through which aspects of its operation may be configured through the use of a web browser application program executing on user computer 702. Alternately, a stand-alone application program executing on user computer 702 might access an application programming interface (API) exposed by data center 710 for performing the configuration operations. Other mechanisms for configuring the operation of various web services available at data center 710 might also be utilized.

Servers 716 shown in FIG. 7 may be standard servers configured appropriately for providing the computing resources described above and may provide computing resources for executing one or more web services and/or applications. In one embodiment, the computing resources may be virtual machine instances 718. In the example of virtual machine instances, each of the servers 716 may be configured to execute an instance manager 720a or 720b (which may be referred herein singularly as instance manager 720) or in the plural as instance managers 720) capable of executing the virtual machine instances 718. The instance managers 720) may be a virtual machine monitor (VMM) or another type of program configured to enable the execution of virtual machine instances 718 on server 716, for example. As discussed above, each of the virtual machine instances 718 may be configured to execute all or a portion of an application.

It should be appreciated that although the embodiments disclosed above discuss the context of virtual machine instances, other types of implementations can be utilized with the concepts and technologies disclosed herein. For example, the embodiments disclosed herein might also be utilized with computing systems that do not utilize virtual machine instances.

In the example data center 710 shown in FIG. 7, a router 714 may be utilized to interconnect the servers 716a and 716*b*. Router 714 may also be connected to gateway 740, which is connected to communications network 730. Router 714 may be connected to one or more load balancers, and alone or in combination may manage communications within networks in data center 710, for example by forwarding packets or other data communications as appropriate based on characteristics of such communications (e.g., header information including source and/or destination addresses, protocol identifiers, size, processing requirements, etc.) and/or the characteristics of the private network (e.g., routes based on network topology, etc.). It will be appreciated that, for the sake of simplicity, various aspects of the computing systems and other devices of this example are illustrated without showing certain conventional details. Additional computing systems and other devices may be interconnected in other embodiments and may be interconnected in different ways.

In the example data center 710 shown in FIG. 7, a server manager 715 is also employed to at least in part direct various communications to, from and/or between servers 716*a* and 716*b*. While FIG. 7 depicts router 714 positioned between gateway 740 and server manager 715, this is merely an exemplary configuration. In some cases, for example, server manager 715 may be positioned between gateway 740 and router 714. Server manager 715 may, in some cases, examine portions of incoming communications from user computers 702 to determine one or more appropriate servers 716 to receive and/or process the incoming communications. Server manager 715 may determine appropriate servers to receive and/or process the incoming communications based on factors such as an identity, location or other attributes associated with user computers 702, a nature of a task with which the communications are associated, a priority of a task with which the communications are associated, a duration of a task with which the communications are associated, a size and/or estimated resource usage of a task with which the communications are associated and many other factors. Server manager 715 may, for example, collect or otherwise have access to state information and other information associated with various tasks in order to, for example, assist in managing communications and other operations associated with such tasks.

It should be appreciated that the network topology illustrated in FIG. 7 has been greatly simplified and that many more networks and networking devices may be utilized to interconnect the various computing systems disclosed herein. These network topologies and devices should be apparent to those skilled in the art.

It should also be appreciated that data center 710 described in FIG. 7 is merely illustrative and that other implementations might be utilized. Additionally, it should be appreciated that the functionality disclosed herein might be implemented in software, hardware or a combination of software and hardware. Other implementations should be apparent to those skilled in the art. It should also be appreciated that a server, gateway or other computing device may comprise any combination of hardware or software that can interact and perform the described types of functionality, including without limitation desktop or other computers, database servers, network storage devices and other network devices, PDAs, tablets, cellphones, wireless phones, pagers, electronic organizers, videogame consoles, Internet appliances, television-based systems (e.g., using set top boxes and/or personal/digital video recorders) and various other consumer products that include appropriate communication capabilities. In addition, the functionality provided by the illustrated modules may in some embodiments be combined in fewer modules or distributed in additional modules. Similarly, in some embodiments the functionality of some of the illustrated modules may not be provided and/or other additional functionality may be available.

Figure 8:
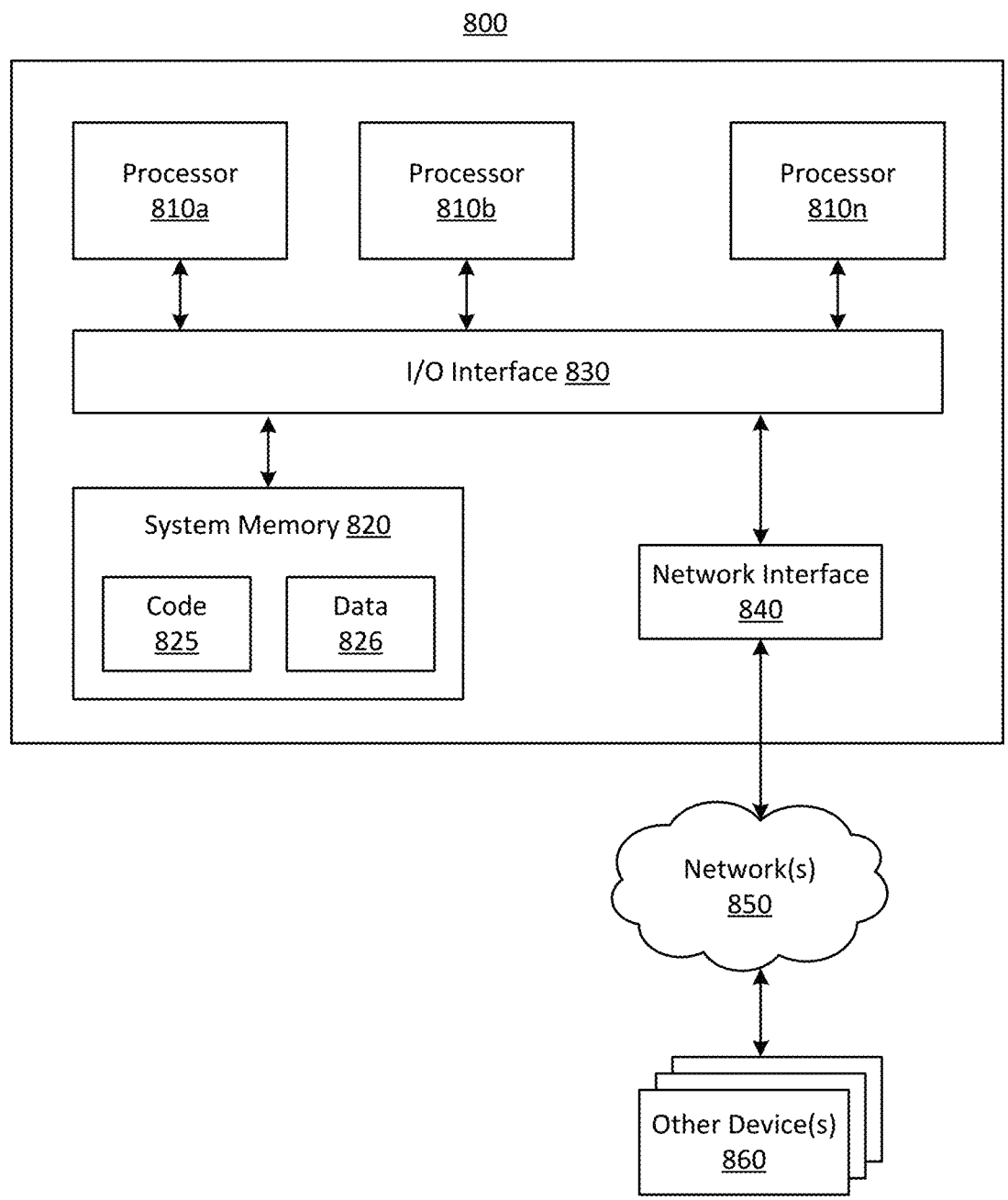
FIG. 8 is a diagram illustrating an example computing system that may be used in some embodiments.

In at least some embodiments, a server that implements a portion or all of one or more of the technologies described herein may include a general-purpose computer system that includes or is configured to access one or more computer-accessible media. FIG. 8 depicts a general-purpose computer system that includes or is configured to access one or more computer-accessible media. The example computer system of FIG. 8 may be configured to implement the communications service system 104 of FIGS. 1A-B and/or the media conferencing service 204, the organizer 214, the participant nodes 212A-E, or a combination thereof of FIG. 2. The example computer system of FIG. 8 may be configured to implement any of the methods described herein, such as any methods (e.g., or any operations) associated with FIGS. 3A-5.

In the illustrated embodiment, computing system 800 includes one or more processors 810*a*, 810*b* and/or 810*n* (which may be referred herein singularly as "a processor 810" or in the plural as "the processors 810") coupled to a system memory 820 via an input/output (I/O) interface 830. Computing system 800 further includes a network interface 840 coupled to I/O interface 830.

In various embodiments, the computing system 800 may be a uniprocessor system including one processor 810 or a multiprocessor system including several processors 810 (e.g., two, four, eight or another suitable number). Processors 810 may be any suitable processors capable of executing instructions. For example, in various embodiments, processors 810 may be general-purpose or embedded processors implementing any of a variety of instruction set architectures (ISAs), such as the x86, PowerPC, SPARC or MIPS ISAs or any other suitable ISA. In multiprocessor systems, each of processors 810 may commonly, but not necessarily, implement the same ISA.

System memory 820 may be configured to store instructions and data accessible by processor(s) 810. In various embodiments, system memory 820 may be implemented using any suitable memory technology, such as static random access memory (SRAM), synchronous dynamic RAM (SDRAM), nonvolatile/FlashR-type memory or any other type of memory. In the illustrated embodiment, program instructions and data implementing one or more desired functions, such as those methods, techniques and data described above, are shown stored within system memory 820 as code 825 and data 826.

In an embodiment, I/O interface 830 may be configured to coordinate I/O traffic between processor 810, system memory 820 and any peripherals in the device, including network interface 840) or other peripheral interfaces. In some embodiments, I/O interface 830) may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830) may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computing system 800 and other device or devices 860 attached to a network or networks 850, such as other computer systems or devices, for example. In various embodiments, network interface 840) may support communication via any suitable wired or wireless general data networks, such as types of Ethernet networks, for example. Additionally, network interface 840 may support communication via telecommunications/telephony networks such as analog voice networks or digital fiber communications networks, via storage area networks such as Fiber Channel SANs (storage area networks) or via any other suitable type of network and/or protocol.

In some embodiments, system memory 820 may be a computer-accessible medium configured to store program instructions and data as described above for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing system 800 via I/O interface 830. A non-transitory computer-accessible storage medium may also include any volatile or non-volatile media such as RAM (e.g. SDRAM, DDR SDRAM, RDRAM, SRAM, etc.), ROM (read only memory) etc., that may be included in some embodiments of computing system 800 as system memory 820 or another type of memory. Further, a computer-accessible medium may include transmission media or signals such as electrical, electromagnetic or digital signals conveyed via a communication medium such as a network and/or a wireless link, such as those that may be implemented via network interface 840. Portions or all of multiple computing devices such as those illustrated in FIG. 8 may be used to implement the described functionality in various embodiments: for example, software components running on a variety of different devices and servers may collaborate to provide the functionality. In some embodiments, portions of the described functionality may be implemented using storage devices, network devices or special-purpose computer systems, in addition to or instead of being implemented using general-purpose computer systems. The term "computing system," as used herein, refers to at least all these types of devices and is not limited to these types of devices.

A compute node, which may be referred to also as a computing node, may be implemented on a wide variety of computing environments, such as commodity-hardware computers, virtual machines, web services, computing clusters and computing appliances. Any of these computing devices or environments may, for convenience, be described as compute nodes.

A network set up by an entity such as a company or a public sector organization to provide one or more web services (such as various types of cloud-based computing or storage) accessible via the Internet and/or other networks to a distributed set of clients may be termed a provider network. Such a provider network may include numerous data centers hosting various resource pools, such as collections of physical and/or virtualized computer servers, storage devices, networking equipment, and the like, needed to implement and distribute the infrastructure and web services offered by the provider network. The resources may in some embodiments be offered to clients in various units related to the web service, such as an amount of storage for storage, processing capability for processing, as instances, as sets of related services and the like. A virtual computing instance may, for example, comprise one or more servers with a specified computational capacity (which may be specified by indicating the type and number of CPUs, the main memory size and so on) and a specified software stack (e.g., a particular version of an operating system, which may in turn run on top of a hypervisor).

A number of different types of computing devices may be used singly or in combination to implement the resources of the provider network in different embodiments, including general purpose or special purpose computer servers, storage devices, network devices and the like. In some embodiments a client or user may be provided direct access to a resource instance, e.g., by giving a user an administrator login and password. In other embodiments the provider network operator may allow clients to specify execution requirements for specified client applications and schedule execution of the applications on behalf of the client on execution platforms (such as application server instances, Java™ virtual machines (JVMs), general purpose or special-purpose operating systems, platforms that support various interpreted or compiled programming languages such as Ruby, Perl, Python, C. C++ and the like or high-performance computing platforms) suitable for the applications, without, for example, requiring the client to access an instance or an execution platform directly. A given execution platform may utilize one or more resource instances in some implementations: in other implementations multiple execution platforms may be mapped to a single resource instance.

In many environments, operators of provider networks that implement different types of virtualized computing, storage and/or other network-accessible functionality may allow customers to reserve or purchase access to resources in various resource acquisition modes. The computing resource provider may provide facilities for customers to select and launch the desired computing resources, deploy application components to the computing resources and maintain an application executing in the environment. In addition, the computing resource provider may provide further facilities for the customer to quickly and easily scale up or scale down the numbers and types of resources allocated to the application, either manually or through automatic scaling, as demand for or capacity requirements of the application change. The computing resources provided by the computing resource provider may be made available in discrete units, which may be referred to as instances. An instance may represent a physical server hardware platform, a virtual machine instance executing on a server or some combination of the two. Various types and configurations of instances may be made available, including different sizes of resources executing different operating systems (OS) and/or hypervisors, and with various installed software applications, runtimes and the like. Instances may further be available in specific availability zones, representing a logical region, a fault tolerant region, a data center or other geographic location of the underlying computing hardware, for example. Instances may be copied within an availability zone or across availability zones to improve the redundancy of the instance, and instances may be migrated within a particular availability zone or across availability zones. As an example, the latency for client communications with a particular server in an availability zone may be less than the latency for client communications with a different server. As such, an instance may be migrated from the higher latency server to the lower latency server to improve the overall client experience.

In some embodiments the provider network may be organized into a plurality of geographical regions, and each region may include one or more availability zones. An availability zone (which may also be referred to as an availability container) in turn may comprise one or more distinct locations or data centers, configured in such a way that the resources in a given availability zone may be isolated or insulated from failures in other availability zones. That is, a failure in one availability zone may not be expected to result in a failure in any other availability zone. Thus, the availability profile of a resource instance is intended to be independent of the availability profile of a resource instance in a different availability zone. Clients may be able to protect their applications from failures at a single location by launching multiple application instances in respective availability zones. At the same time, in some implementations inexpensive and low latency network connectivity may be provided between resource instances that reside within the same geographical region (and network transmissions between resources of the same availability zone may be even faster).

Each of the processes, methods, and algorithms described in the preceding sections may be embodied in, and fully or partially automated by, code modules executed by one or more computers or computer processors. The code modules may be stored on any type of non-transitory computer-readable medium or computer storage device, such as hard drives, solid state memory, optical disc and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. The example systems and components described herein may be configured differently than described. For example, elements may be added to, removed from or rearranged compared to the disclosed example embodiments.

It will also be appreciated that various items are illustrated as being stored in memory or on storage while being used, and that these items or portions thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the modules, systems and data structures may also be stored (e.g., as software instructions or structured data) on a computer-readable medium, such as a hard disk, a memory, a network or a portable media article to be read by an appropriate drive or via an appropriate connection. The systems, modules and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising." "including." "having." and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some or all of the elements in the list.

While certain example embodiments have been described, these embodiments have been presented by way of example only and are not intended to limit the scope of the inventions disclosed herein. Thus, nothing in the foregoing description is intended to imply that any particular feature, characteristic, step, module or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

What is claimed is:

1. A method for generating a composite input signal, the method comprising:
    identifying a participant device to a media conference;
    selecting, in response to the identifying the participant device, a first input device of the participant device as a selected input device;
    receiving, from the first input device, a first input signal;
    determining that a first characteristic of the first input signal does not satisfy a threshold;

activating, in response to the determining that the first characteristic of the first input signal does not satisfy the threshold, a second input device of the participant device;
receiving, from the second input device, a second input signal;
combining the first input signal and the second input signal into the composite input signal;
determining that the composite input signal has a higher quality than either the first input signal or the second input signal individually; and
outputting the composite input signal.

2. The method of claim 1, further comprising receiving, from a third input device of the participant device, a third input signal,
wherein combining the first input signal and the second input signal into the composite input signal comprises combining the first input signal, the second input signal, and the third input signal into the composite input signal.

3. The method of claim 1, wherein combining the first input signal and the second input signal into the composite input signal is via at least one of a learning algorithm or blind signal separation.

4. The method of claim 1, wherein combining the first input signal and the second input signal into the composite input signal comprises at least one of normalizing speech levels in the first input signal and the second input signal, aligning speech in the first input signal and the second input signal, aligning video in the first input signal and the second input signal, or correcting phase in the first input signal and the second input signal.

5. The method of claim 1, further comprising:
determining that the second input signal is no longer being received;
receiving, in response to determining that the second input signal is no longer being received, a third input signal from a third input device of the participant device; and
combining the first input signal and the third input signal into an updated composite input signal.

6. The method of claim 1, further comprising:
determining that a third input device is available to the participant device;
activating, in response to determining that the third input device is available, the third input device;
determining a second characteristic of the second input signal;
receiving, from the third input device, a third input signal;
determining a third characteristic of the third input signal;
comparing the second characteristic to the third characteristic;
determining, based on comparing the second characteristic to the third characteristic, that a quality of the third input signal is greater than a quality of the second input signal;
combining the first input signal and the third input signal into an updated composite input signal; and
outputting the updated composite input signal.

7. A media conferencing service comprising:
a computing node and a non-transitory computer-readable medium, the non-transitory computer-readable medium having stored therein computer-readable instructions that, upon execution by the computing node, configure the media conferencing service to perform operations comprising:
receiving, from a first microphone, a first audio signal;
determining that a characteristic of the first audio signal does not satisfy a threshold;
activating, in response to the determining that the characteristic of the first audio signal does not satisfy the threshold, a second microphone;
receiving, from the second microphone, a second audio signal;
combining the first audio signal and the second audio signal into a composite audio signal;
determining that the composite audio signal has a higher quality than either the first audio signal or the second audio signal individually; and
selecting the composite audio signal for use by the media conferencing service as part of a media conference.

8. The media conferencing service of claim 7, wherein the computer-readable instructions upon execution further configure the media conferencing service to:
identify the computing node to the media conference; and
subsequently select, the first microphone as an initial microphone.

9. The media conferencing service of claim 7, wherein the computer-readable instructions upon execution further configure the media conferencing service to receive, from a third microphone, a third audio signal,
wherein the computer-readable instructions upon execution configure the media conferencing service to combine the first audio signal and the second audio signal into the composite audio signal by combining the first audio signal, the second audio signal, and the third audio signal into the composite audio signal.

10. The media conferencing service of claim 7, wherein the computer-readable instructions upon execution configure the media conferencing service to combine the first audio signal and the second audio signal into the composite audio signal via at least one of a learning algorithm or blind signal separation.

11. The media conferencing service of claim 7, wherein the computer-readable instructions upon execution configure the media conferencing service to combine the first audio signal and the second audio signal into the composite audio signal by at least one of normalizing speech levels in the first audio signal and the second audio signal or aligning speech in the first audio signal and the second audio signal.

12. The media conferencing service of claim 7, wherein the computer-readable instructions upon execution further configure the media conferencing service to:
determine that the second audio signal is no longer being received;
receive, in response to determining that the second audio signal is no longer being received, a third audio signal from a third microphone; and
combine the first audio signal and the third audio signal into an updated composite audio signal.

13. The media conferencing service of claim 7, wherein the computer-readable instructions upon execution further configure the media conferencing service to:
sample the first audio signal,
wherein the determining that the characteristic of the first audio signal does not satisfy the threshold is based on a sample of the first audio signal.

14. A non-transitory computer-readable storage medium having stored thereon computer-readable instructions, the computer-readable instructions comprising instructions that, upon execution on one or more computing devices, at least cause:
receiving, from a first input device, a first input signal;

determining that a characteristic of the first input signal does not satisfy a threshold;

activating, in response to the determining that the characteristic of the first input signal does not satisfy the threshold, a second input device;

receiving, from the second input device, a second input signal;

combining the first input signal and the second input signal into a composite input signal; and determining that the composite input signal has a higher quality than either the first input signal or the second input signal individually; and selecting the composite input signal.

15. The non-transitory computer-readable storage medium of claim 14, wherein the instructions, upon execution on the one or more computing devices, further cause:

identifying a participant device to a media conference; and selecting, in response to the identifying the participant device, the first input device of the participant device as a selected input device.

16. The non-transitory computer-readable storage medium of claim 14, wherein the instructions, upon execution on the one or more computing devices, further cause receiving, from a third input device, a third input signal, wherein the instructions, upon execution on the one or more computing devices, cause combining the first input signal and the second input signal into the composite input signal by combining the first input signal, the second input signal, and the third input signal into the composite input signal.

17. The non-transitory computer-readable storage medium of claim 14, wherein the instructions, upon execution on the one or more computing devices, cause combining the first input signal and the second input signal into the composite input signal via at least one of a learning algorithm or blind signal separation.

* * * * *